US008713388B2

(12) United States Patent
Chen et al.

(10) Patent No.: US 8,713,388 B2
(45) Date of Patent: Apr. 29, 2014

(54) INTEGRATED CIRCUIT TESTING WITH POWER COLLAPSED

(75) Inventors: Wei Chen, San Diego, CA (US); Yucong Tao, San Diego, CA (US); Matthew L. Severson, San Diego, CA (US); Jeffrey R. Gemar, San Diego, CA (US); Chang Yong Yang, Fayetteville, NC (US)

(73) Assignee: QUALCOMM Incorporated, San Diego, CA (US)

( * ) Notice: Subject to any disclaimer, the term of this patent is extended or adjusted under 35 U.S.C. 154(b) by 419 days.

(21) Appl. No.: 13/032,732

(22) Filed: Feb. 23, 2011

(65) Prior Publication Data

US 2012/0216089 A1 Aug. 23, 2012

(51) Int. Cl.
*G01R 31/28* (2006.01)

(52) U.S. Cl.
USPC .......................................... 714/724; 714/718

(58) Field of Classification Search
USPC .................................................. 714/724, 727
See application file for complete search history.

(56) References Cited

U.S. PATENT DOCUMENTS

| | | | |
|---|---|---|---|
| 6,043,672 A * | 3/2000 | Sugasawara | 324/750.3 |
| 6,950,359 B2 | 9/2005 | Chen et al. | |
| 7,369,815 B2 | 5/2008 | Kang et al. | |
| 7,521,762 B2 * | 4/2009 | Hidaka | 257/369 |
| 7,622,955 B2 * | 11/2009 | Vilangudipitchai et al. | 326/68 |
| 2005/0064829 A1 | 3/2005 | Kang et al. | |
| 2006/0125470 A1 | 6/2006 | Chen et al. | |
| 2007/0214389 A1 | 9/2007 | Severson et al. | |
| 2009/0206868 A1 | 8/2009 | Laisne et al. | |
| 2011/0022859 A1 * | 1/2011 | More et al. | 713/300 |
| 2011/0119646 A1 * | 5/2011 | Murray et al. | 716/102 |
| 2012/0185719 A1 * | 7/2012 | Taylor et al. | 713/324 |

FOREIGN PATENT DOCUMENTS

WO WO2010055462 A1 5/2010

OTHER PUBLICATIONS

Ghosh, S. et al. "Shannon expansion based supply-gated logic for improved power and testability". Source: Proceedings of the Asian Test Symposium, v 2005, p. 404-409, 2005, Proceedings—14th Asian Test Symposium, ATS 2005. ISSN: 10817735 ISBN-10: 0769524818.
Ley, A.W. "Doing more with less—an IEEE 1149.7 embedded tutorial: standard for reduced-pin and enhanced-functionality test access port and boundary-scan architecture". Source: Proceedings of the 2009 IEEE International Test Conference (ITC 2009),10 pages, 2009 ISBN-13: 978-1-4244-4868-5.

(Continued)

*Primary Examiner* — Esaw Abraham
(74) *Attorney, Agent, or Firm* — Sam Talpalatsky; Nicholas J. Pauley; Joseph Agusta

(57) ABSTRACT

In examples, apparatus and methods are provided for an integrated circuit. The integrated circuit includes a first integrated circuit portion having a main power domain and a second integrated circuit portion having a collapsible power domain. The integrated circuit also has a level shifter having an input coupled to the second circuit portion and an output coupled to the first integrated circuit portion. The level shifter is configured to hold constant the level shifter output when power to the collapsible power domain is collapsed. A quiescent drain current measurement circuit can be coupled to test at least a part of the second integrated circuit portion. A boundary scan register can be coupled between the level shifter output and the first integrated circuit portion. The integrated circuit can also include a power management circuit.

37 Claims, 18 Drawing Sheets

(56) References Cited

OTHER PUBLICATIONS

Patel, M.R. et al. "IDDQ test methodology and tradeoffs for scan/non-scan designs". Test Symposium, 1998. ATS '98. Proceedings. Seventh Asian. Issue Date: Dec. 2-4, 1998, p. 138-143. Meeting Date: Dec. 2, 1998-Dec. 4, 1998 ISBN: 0-8186-8277-9.

Chickermane et al., "A Power-Aware Test Methodology for Multi-Supply Multi-Voltage Designs", IEEE International Test Conference (ITC), Oct. 28, 2008, pp. 1-10, XP031669345, IEEE, ISBN: 978-1-4244-2402-3, DOI: 10.1109/TEST.2008.4700572.

International Search Report and Written Opinion—PCT/US2012/026311—ISA/EPO—Jun. 22, 2012.

\* cited by examiner

INTEGRATED CIRCUIT TESTING WITH POWER COLLAPSED

FIELD OF DISCLOSURE

This application relates generally to electronic devices and more specifically, but not exclusively, to integrated circuits.

BACKGROUND

An integrated circuit (IC) can be conventionally tested in a quiescent state (i.e., a sleep state), when there is no switching activity in the IC and the inputs to the IC are static. One type of quiescent state testing is known as IDDQ testing (a.k.a. quiescent current testing), in which a steady state supply current (Idd) is measured to ascertain leakage current flowing through the IC during the sleep state. IDDQ testing is a very effective test method for testing Complementary Metal-Oxide Semiconductor (CMOS) circuits, as detecting high static currents can reveal faults which cannot be found by other conventional testing methods during a powered-up state. Thus, IDDQ testing can significantly improve the quality and reliability of fabricated circuits. IDDQ testing is particularly important because IC gate counts and transistor counts are increasing, while feature size is decreasing, which lead to increases in power consumption.

IDDQ testing is based on the concept that the IC does not draw significant current when in a quiescent state. In other words, in a sleep state, only leakage current flows through the IC. When a significant leakage current flows through the device under test during a quiescent state, the leakage current indicates a manufacturing defect in the device. A defect causing the leakage current detrimentally affects the functionality of the circuit and/or the reliability of the circuit. The defect also reduces the duration of sleep time of the user product into which the device is integrated, because the leakage current drains batteries. Battery life is a key requirement for mobile devices, such as wireless communication devices.

Another way to test ICs is by using conventional automatic test pattern generation (ATPG) techniques. The ATPG techniques are typically used for testing ICs post-manufacture by applying test patterns to the IC and observing the IC's outputs. Classic ATPG scan models detect faults such as stuck-at-faults. Conventional techniques cannot perform ATPG testing, such as ATPG IDDQ testing, while the IC is in a sleep or power collapsed state.

There are long-felt industry needs to improve upon classic designs and methods, to address the aforementioned issues.

SUMMARY

Exemplary embodiments of the invention are directed to methods and apparatus for integrated circuit testing. For example, the exemplary embodiments described hereby provide, among other advantages, methods and apparatus to perform quiescent current testing and automatic test pattern generation while the device under test is in a sleep state, which identifies defects that are undetectable with conventional techniques. The exemplary embodiments and aspects provided advantageously address the long-felt needs in the industry.

In an example, provided is an integrated circuit (IC). The IC has a first integrated circuit portion having a main power domain and a second integrated circuit portion having a collapsible power domain. The IC includes a level shifter having an input coupled to the second circuit portion, and an output coupled to the first integrated circuit portion. The level shifter is configured to hold constant the level shifter output when power to the collapsible power domain is collapsed. The IC can include a quiescent drain current measurement circuit coupled to test at least a part of the second integrated circuit portion. In an example, the level shifter has at least two output voltage levels. The IC can further include a boundary scan register coupled between the level shifter output and the first integrated circuit portion. In an example, the IC includes a power management circuit configured to generate a level shifter control signal and an inverted version of the level shifter control signal, each being output to the level shifter via a respective boundary scan register. A test access port can be coupled to control the power management circuit and the boundary scan registers. The power management circuit can be configured to generate a port isolation signal, a memory isolation signal, a scan and test chain isolation signal, a single serial bus interface isolation signal, and/or an off-chip memory interface isolation signal. The IC can be integrated on a semiconductor die. A device, such as a set top box, music player, video player, entertainment unit, navigation device, communications device, personal digital assistant (PDA), fixed location data unit, and a computer, can have the IC as an integrated component.

In a further example, provided is a method for testing an integrated circuit (IC). The method includes integrating a test controller and a power manager in a main power domain of the integrated circuit, generating an isolation signal using the power manager, isolating the main power domain from a power-collapsible domain of the integrated circuit with the isolation signal, collapsing power of the power-collapsible domain, and testing the power-collapsible domain, when power is collapsed, using the test controller and the power manager. The test controller can be Joint Test Action Group (JTAG)-compatible. The isolation signal can comprise at least one of a freeze signal for isolating input-output ports of the integrated circuit or a clamp signal for isolating a functional module of the integrated circuit. The method can further include storing the isolation signal in a boundary scan register, and controlling a boundary scan register with the test controller. The testing of the power-collapsible domain can include testing a power supply current.

Also provided in another example is an integrated circuit (IC) that includes a test controller and a power manager in a main power domain of the IC, means for generating an isolation signal using the power manager, and means for isolating the main power domain from a power-collapsible domain of the integrated circuit with the isolation signal. The IC also includes means for collapsing power of the power-collapsible domain and means for testing the power-collapsible domain, when power is collapsed, using the test controller and the power manager. The test controller can be Joint Test Action Group-compatible. The isolation signal can include at least one of a freeze signal for isolating input-output ports of the integrated circuit, or a clamp signal for isolating a functional module of the integrated circuit. The IC can further include means for storing the isolation signal in a boundary scan register and means for controlling a boundary scan register with the test controller. The means for testing the power-collapsible domain can comprise means for testing a power supply current.

In a further example, provided is a non-transitory computer-readable medium, comprising instructions stored thereon that, if executed by a lithographic apparatus, cause the lithographic apparatus to fabricate at least a part of a device. The device has a first integrated circuit portion having a main power domain, a second integrated circuit portion having a collapsible power domain, and a level shifter having an input coupled to the second circuit portion and an output coupled to the first integrated circuit portion. The level shifter is configured to hold constant the level shifter output when power to the collapsible power domain is collapsed. The instructions can further cause the lithographic apparatus to fabricate a quiescent drain current measurement circuit coupled to test at least a part of the second integrated circuit portion. The level shifter can have at least two output voltage levels. The instructions can also cause the lithographic apparatus to fabricate a boundary scan register coupled between the level shifter output and the first integrated circuit portion. The instructions can further cause the lithographic apparatus to fabricate a power management circuit configured to generate a level shifter control signal and an inverted version of the level shifter control signal, each being output to the level shifter via a respective boundary scan register. The instructions can further cause the lithographic apparatus to fabricate a test access port coupled to the control power management circuit and the boundary scan registers. The power management circuit can be configured to generate a port isolation signal, a memory isolation signal, a scan and test chain isolation signal, a single serial bus interface isolation signal, and/or an off-chip memory interface isolation signal.

The foregoing has broadly outlined exemplary features and technical advantages of the present teachings in order that the detailed description that follows may be better understood. Additional features and advantages are described herein. The conception and specific embodiments disclosed can be readily utilized as a basis for modifying or designing other structures for carrying out the same purposes of the present teachings. Such equivalent constructions do not depart from the technology of the teachings as set forth in the appended claims. The novel features which are characteristic of the teachings, together with further advantages are better understood from the following description, when considered in connection with the accompanying figures. Each of the figures is provided for the purpose of illustration and description only, and does not define limits of the present teachings.

BRIEF DESCRIPTION OF THE DRAWINGS

The accompanying drawings are presented to describe examples of the present teachings, and are not provided as limitations.

Figure 1:
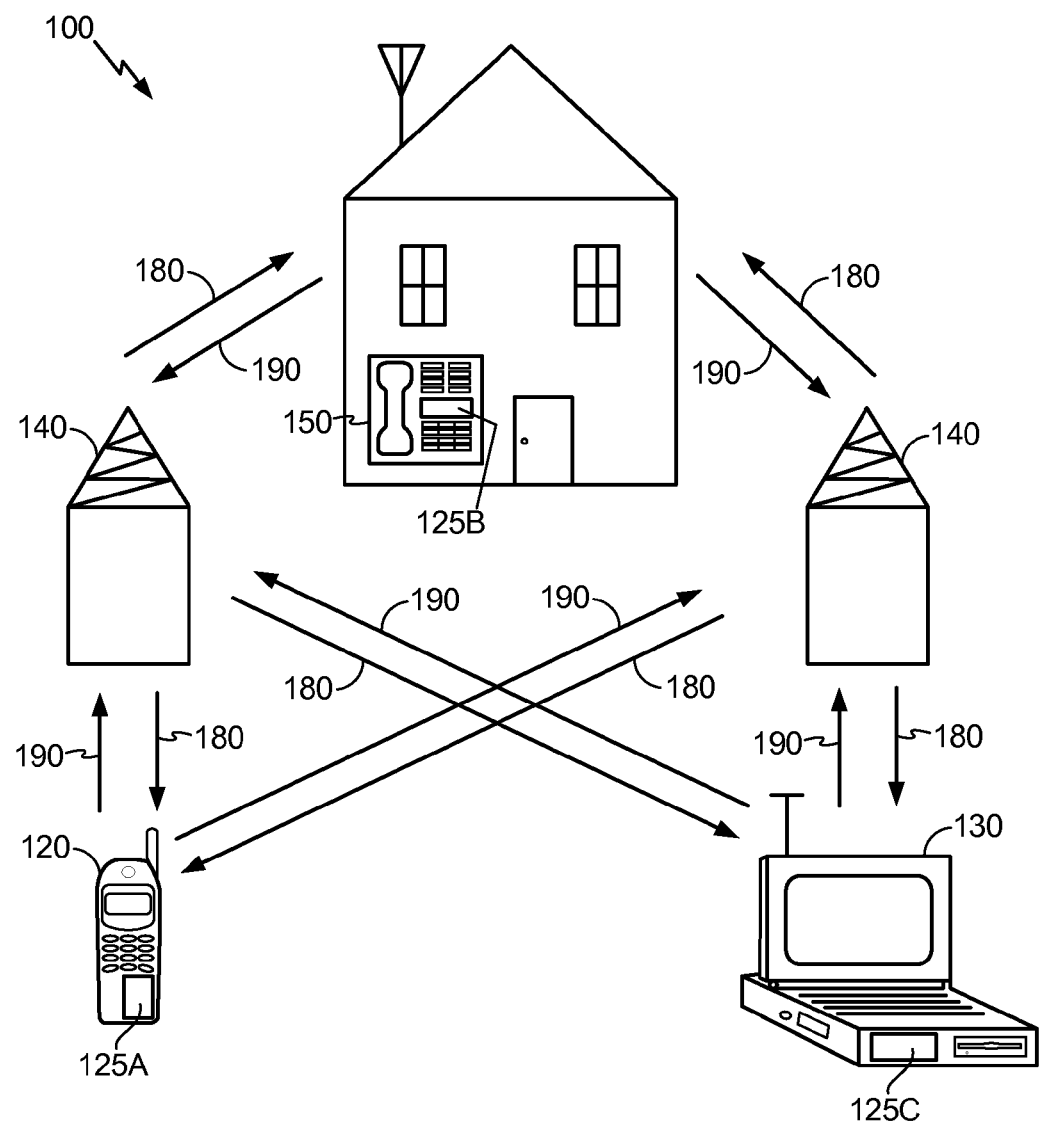
FIG. 1 depicts an exemplary communication system.

In accordance with common practice, the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Examples are disclosed in the following description and related drawings directed to specific embodiments of the invention. Alternate embodiments can be devised without departing from the scope of the invention. Additionally, well-known elements are not described in detail or are omitted, so as not to obscure relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. Also, the terms buffer and driver are used interchangeably herein.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

It should be understood that the term "signal" can include any signal such as a data signal, audio signal, video signal, multimedia signal. Information and signals can be represented using any of a variety of different technologies and techniques. For example, data, instructions, commands, information, signals, bits, symbols, and chips that can be referenced throughout this description can be represented by voltages, currents, electromagnetic waves, magnetic fields or particles, optical fields or particles, or any combination thereof.

It should be understood that any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element. Also, unless stated otherwise a set of elements can comprise one or more elements. In addition, terminology of the form "at least one of: A, B, or C" used in the description or the claims means "A or B or C or any combination of these elements."

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

ABBREVIATIONS

The following list of frequently-used abbreviations and acronyms are provided to assist the reader in comprehending the current disclosure, and are not provided as limitations.

AO: Always-on power domain; a power domain that is powered when power is supplied to a circuit.
ATPG: Automatic test pattern generation.
BSC: Boundary scan cell.
BSCAN: Boundary scan register that comprises at least one BSC.
Clamp_io: Generic clamp signal for internal modules.
Clamp_io_m: Clamp signal paired with clamp_io, in a memory domain.
Clamp_jtag: Clamp signal for on-chip JTAG chains.
Clamp_jtag_m: Clamp signal paired with clamp_jtag, in the memory domain, for clamping JTAG chain.
Clamp_mem_m: Clamp signal for on-chip memories, in the memory domain.
Clamp_ssbi: Clamp signal for clamping the SSBI lines.
Clamp_ssbi_m: Clamp signal paired with clamp_ssbi signal.
EN: Enable signal in the AO domain.
EN_MX: Enable signal in the VDDMX domain.
Freeze_io: Freeze signal for generic isolation signal for GPIOs.
Freeze_io_ebi1: Freeze signal for ebi1 off-chip memory interface.
Freeze_io_ebi2: Freeze signal for ebi2 off-chip memory interface.
Freeze_io_jtag_dbg: Freeze signal for JTAG interface IOs.
Freeze_io_jtag_dbg_m: Freeze signal paired with freeze_io_jtag_dbg, in the memory domain.
Freeze_io_m: This freeze signal is in memory domain, and can be paired with the following signals: Freeze_io, prefreeze_io, freeze_io_ebi1, freeze_ebi2.
IC: Integrated circuit.
IDDQ: Quiescent drain current.
IO: In/Out port(s)
JTAG: Joint Test Action Group.
KEEPER: Maintained prior output. Can be based on a clamped input voltage.
MPM: MSM Power Manager.
MSM: Mobile station modem.
PMIC: Power management integrated circuit.
Prefreeze_io: Generic isolation signal for GPIOs with timing requirement being de-asserted earlier than freeze_io.
Preclamp_io: Generic clamp signal for internal IPs with early timing requirement.
Preclamp_io_m: A preclamp signal paired with preclamp_io, in the memory domain.
RTCK: Return test clock.
SOC: System on a chip.
SSBI: Single wire serial bus interface.
TAP: Test access port.
TCK: Test clock.
TMS: Test mode state.
TDI: Test data in.
TDO: Test data out.
TRST: Test reset.

VDDCX: Power supply voltage in the power-collapsible power domain.
VDDMX: Intermediate power supply voltage in the main power domain.
VDDPX: Power supply voltage in the always-on power domain.
VDD_MIN: lower power supply voltage.

INTRODUCTION

In exemplary embodiments, provided are apparatus and methods for measuring current leakage in a portion of an IC while power is collapsed to the portion under test. A mobile station modem Power Manager (MPM) outputs freeze and clamp signals, which are stored in boundary scan registers (BSCAN). "Freeze" signals denote signals for isolating in/out ports (IOs), and "clamp" signals denote signals for isolating modules on the chip. The freeze and clamp signals control isolating a main power domain (e.g., a power domain that is powered when the IC is supplied power; an always-on power domain) from the power collapsible domain. Multi-stage level shifters interface the main power domain with the power collapsible domain. Automatic test pattern generation (ATPG) quiescent drain current (IDDQ) testing can then be performed on the power collapsed sections of the chip, for example, with a Joint Test Action Group (JTAG)-compatible controller and the freeze and clamp signals.

The provided IDDQ testing with ATPG techniques provide several advantages. The provided techniques reveal circuit faults early in the design process, such as during pre-manufacture, which can screen-out bad circuits early, to reduce further testing costs. The test results can be used to bin the circuits into, for example, a low-sleep current bin, a mid-sleep current bin, and a high sleep current bin. ATPG IDDQ testing performed in a power collapsed mode is very efficient, power aware, and capable of revealing faults which conventional techniques cannot accomplish. The tests enhance test coverage across power-domain boundaries, particularly between collapsible and non-collapsible power-domain boundaries. For example, the tests can detect level-shifter failures, stuck-at fault of clamp values, and sneaky leakage paths at power domain boundaries. Locating the JTAG circuitry in the main power domain enables and enhances debugging circuits through full and partial-chip collapse during chip development. The provided IDDQ testing also provides a way to identify defects whose effects otherwise would be maddeningly intermittent.

DESCRIPTION OF THE FIGURES

FIG. 1 depicts an exemplary communication system 100 in which an embodiment of the disclosure can be advantageously employed. For purposes of illustration, FIG. 1 shows three remote units 120, 130, and 150 and two base stations 140. Conventional wireless communication systems can have many more remote units and base stations. The remote units 120, 130, and 150 include at least a part of an embodiment 125A-C of the disclosure as discussed further below. FIG. 1 shows forward link signals 180 from the base stations 140 and the remote units 120, 130, and 150, as well as reverse link signals 190 from the remote units 120, 130, and 150 to the base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units can be mobile phones, hand-held personal communication systems (PCS) units, portable data units such as personal data assistants, navigation devices (such as GPS enabled devices), set top boxes, music players, video players, entertainment units, fixed location data units (e.g., meter reading equipment), or any other device that stores or retrieves data or computer instructions, or any combination thereof. Although FIG. 1 illustrates remote units, this disclosure is not limited to these exemplary illustrated units. Embodiments of the disclosure can be employed in any suitable device.

Figure 2:
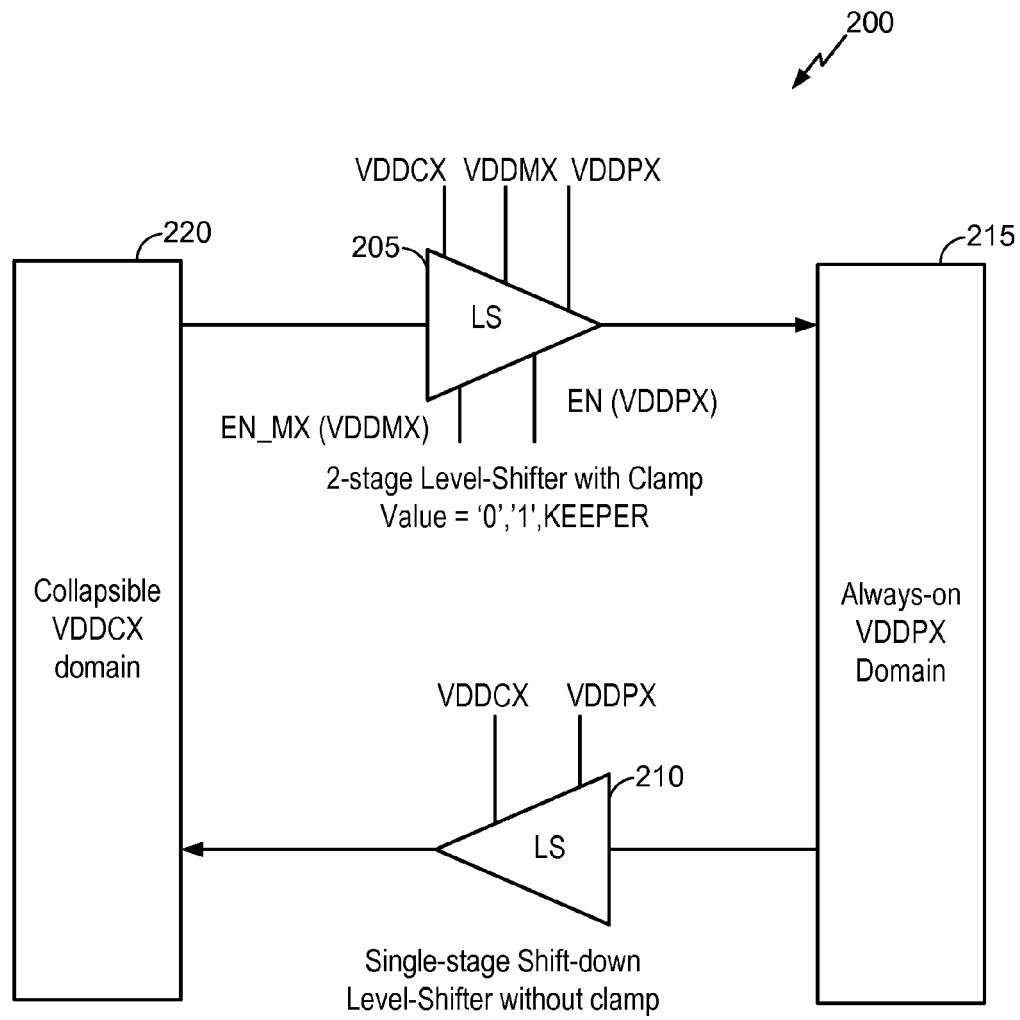
FIG. 2 depicts an exemplary two stage level-shifter circuit.

FIG. 2 depicts an exemplary two-stage level-shifter circuit 200. The two-stage level-shifter circuit 200 has a two-stage level shifter 205 with a clamp (LS w/clamp) and can include a single stage level shifter 210 without a clamp (LS w/o clamp). The two-stage level shifter circuit 200 is used at a boundary between a main power domain 215 and a collapsible power domain 220.

The input to the two-stage level shifter 205 is coupled to the collapsible power domain 220, and the output of the two-stage level shifter 205 is coupled to the main power domain 215. Thus, when the two-stage level shifter 205 is clamped to a last output signal, and the collapsible power domain's power is collapsed, the two-stage level shifter 205 stores and outputs a level-shifted version of the input signal at the moment clamping is enabled.

The input to the single stage level shifter 210 is coupled to the main power domain 215, and the output of the single stage level shifter 210 is coupled to the collapsible power domain 220. Thus, when the collapsible power domain 220 is collapsed, the single stage level shifter 210 does not, and need not, store and output a level-shifted version of the input signal, because the collapsible power domain 220 to which the single stage level shifter 210 outputs a signal is collapsed.

The two-stage level shifter 205 shifts signals from being compatible with the power supply for the power-collapsible power domain (VDDCX) to VDDPX via an intermediate voltage for the main power domain (VDDMX) with output clamp values being 0, 1 or a previous output voltage (KEEPER). The two-stage level-shifter 205 is required because VDDCX can be as low as 0.5V while VDDPX can be as high as 1.95V. This voltage difference is too big for a single-stage level-shifter. The two-stage level-shifter 205 is powered with the intermediate voltage rail, VDDMX (~1.1V).

The two-stage level shifter circuit 200 enables a wider operating voltage range for 45 nm system-on-a-chip (SOC) designs having a supply voltage from 0.5V to 1.1V. The two-stage level shifter circuit 200 also provides significantly better performance (including a faster insertion delay) and area/power/leakage savings, when compared to using a pair of discrete one-stage level shifters, because of the two-stage level shifter circuit's 200 novel circuit implementation. The two-stage level shifter circuit 200 has two separate enable signals, one in the AO domain, EN, and the other in VDDMX domain, EN_MX. The two-stage level shifter 205 is controlled with a clamp signal, which, along with a freeze signal, are described in further detail as follows.

Control signals are required to control the power supply voltage and isolation circuitry in order to isolate the chip IO ports and different power domains during power collapse, or when operating at a low power supply voltage (VDD_MIN). The control signals are identified as variations of freeze signals and clamp signals. In general, freeze_io denotes an isolation control signal applied to a chip-level IO. The term clamp_io denotes an isolation control signal applied to an internal module of the IC under test.

There are different types of freeze_io and clamp_io signals for different general purpose in/out (GPIO) circuits and different modules. Some of the freeze_io and clamp_io signals are special signals that are specifically designed to facilitate the IDDQ test with power collapsed. Examples of different types of freeze_io and clamp_io signals include:

1.) Freeze_io_jtag_dbg and freeze_io_jtag_dbg_m, which specifically control isolating circuits that isolate JTAG IO circuits.

2.) Clamp_mem_m, which specifically controls isolating circuits that isolate an on-chip memory.

3.) Clamp_jtag and clamp_jtag_m, which specifically control isolating circuits that isolate internal scan and/or test chains.

4.) Clamp_ssbi and Clamp_ssbi_m, which specifically control isolating circuits that isolate a single wire serial bus interface (SSBI) signal that communicates with a power management IC (PMIC) to control a supply voltage.

5.) Freeze_io_ebi1 and Freeze_io_ebi2 which specifically control isolating circuits that isolate an off-chip memory interface.

The two-stage level-shifter 205 requires a pair of isolation signals, one in the VDDPX (1.8V) domain, and another in the memory voltage domain (1.1V) (identified with suffix "_m"). One advantage of the two-stage level-shifter design is that it can be tuned to the VDDCX voltage, when the VDDCX has a wider voltage range. For example, the VDDCX voltage can be in a range from substantially 1.2V to substantially 0.5V.

Structurally, the two-stage level shifter 200 is not a trivial cascade of two one-stage level shifters, in part because the two-stage level shifter 200 eliminates an adverse impact of racing condition(s) between the two clamp (or enable) signals (en and en_mx). The "en" signal is the inverse of the "clamp/freeze" signal. Further, the "en_mx" is the inverse of the "clamp_m/freeze_m" signal in the memory domain. In other words, in an example, en=(NOT clamp) or en=(NOT freeze). Further, en_mx=(NOT clamp_m) or en_mx=(NOT freeze_m).

The single stage level shifter 210 is a one-stage, shift-down level shifter from VDDPX to either VDDCX or VDDMX, and does not provide a clamping function.

Figure 3:
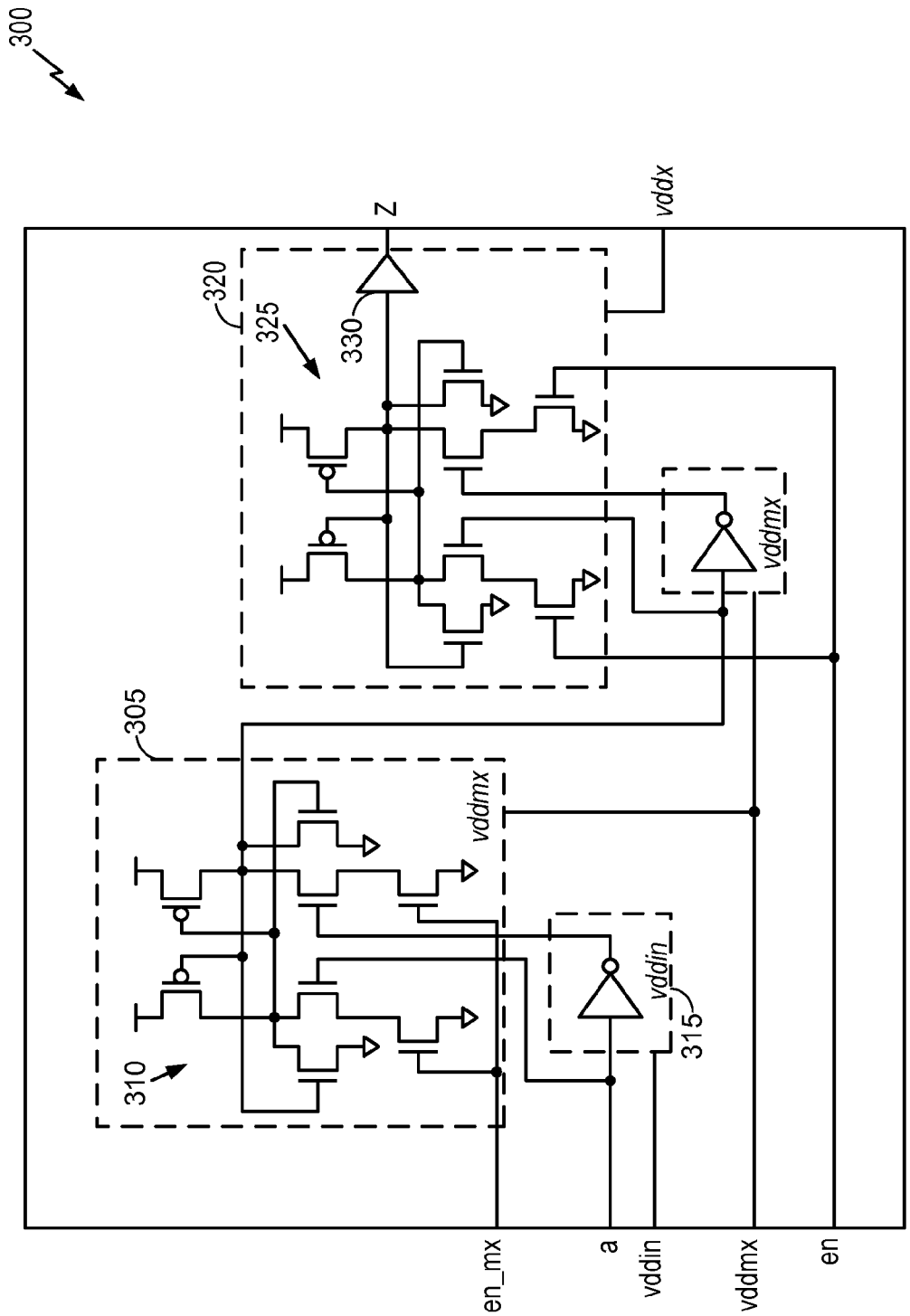
FIG. 3 depicts an exemplary two-stage level-shifter with a clamp.

FIG. 3 depicts an exemplary two-stage level-shifter 300 with a clamp (LS w/clamp) that provides an analog output clamped to an analog voltage-shifted last input value (KEEPER). The two-stage level-shifter 300 has three separately-powered sections. A first section 305 including a first level-shifting stage 310 is powered by a first voltage domain (VDDMX), a second section 315 is powered by VDDIN, and a third section 320 including a second level-shifting stage 325 is powered by a second voltage domain (VDDX). The first level-shifting stage 310 includes an inverter having cross-coupled output drivers with a parallel clamping circuit and serial enable switches. The second level-shifting stage 325 includes an inverter having cross-coupled output drivers with a parallel clamping circuit and serial-coupled enable switches.

During operation, the inverse enable signal (en_mx) controls enablement of the first level-shifting stage 310, and the enable signal (en) controls enablement of the second level-shifting stage 325. An analog signal controlled by the two-stage level shifter 300 is input at an input port (a), and input to the first level-shifting stage 310. The first level-shifting stage 310 shifts the analog voltage level of the input signal to make the input signal compatible with the first voltage domain (VDDMX). The analog output of the first level-shifting stage 310 is input to the second level-shifting stage 325. The second level-shifting stage 325 shifts the analog voltage level of the output of the first level-shifting stage 310 to make the analog output signal compatible with the second voltage domain (VDDX). The analog output of the second level-shifting stage 325 is buffered by a buffer 330, and output at an output port (Z). When power is removed to the portions powered by VDDMX and VDDIN, such as during power collapse, the analog output at the output port (Z) remains constant due to the second stage clamp.

Figure 4:
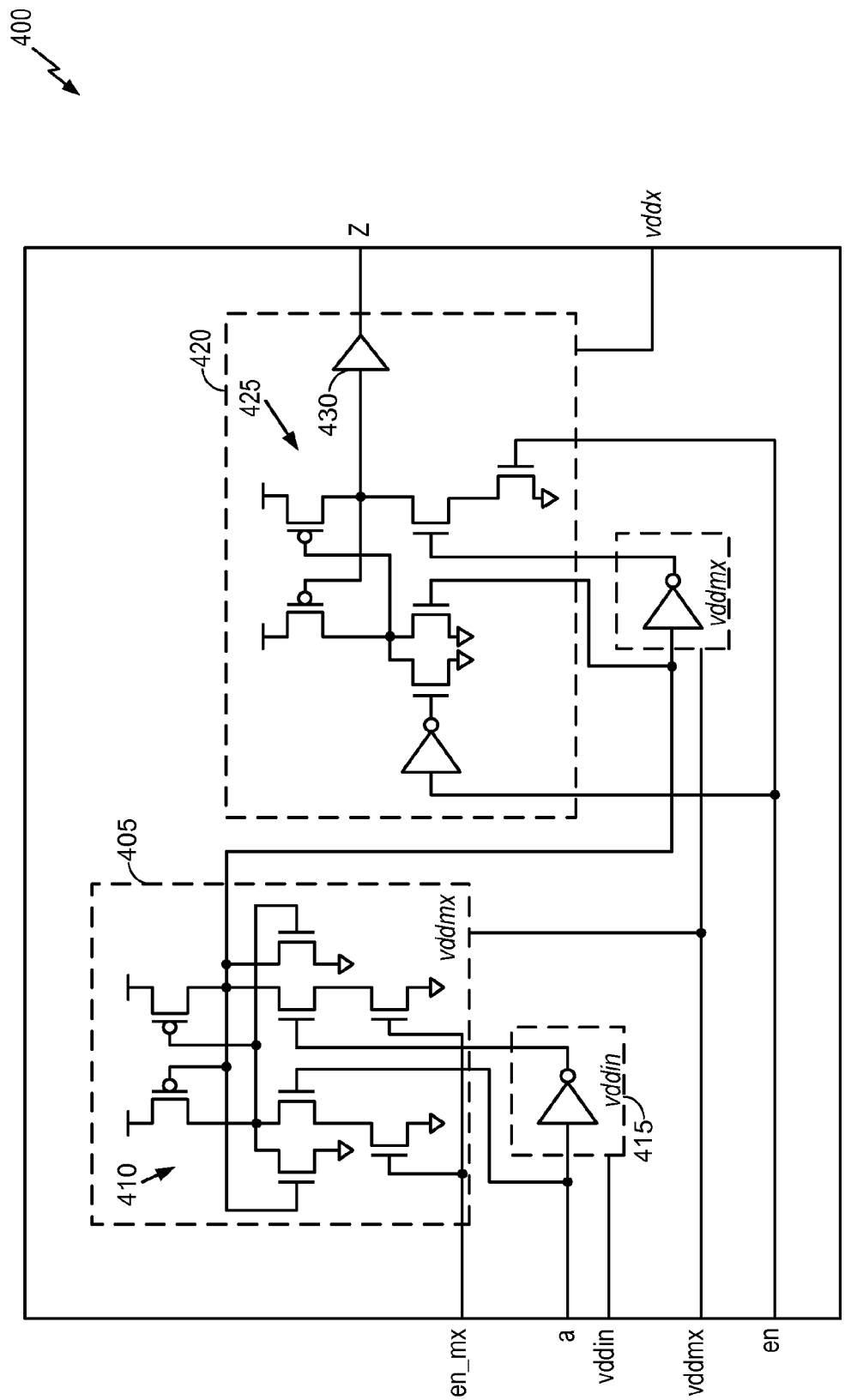
FIG. 4 depicts another exemplary two-stage level-shifter with a clamp.

FIG. 4 depicts an exemplary two-stage level-shifter 400 with a clamp that provides a digital output clamped to a voltage-shifted last digital input value. The two-stage level-shifter 400 has three separately-powered sections. A first section 405 including a first level-shifting stage 410 is powered by a first voltage domain (VDDMX), a second section 415 is powered by VDDIN, and a third section 420 including a second level-shifting stage 425 is powered by VDDX. The first level-shifting stage 410 includes an inverter having cross-coupled output drivers with a parallel clamping circuit and serial enable switches. The second level-shifting stage 425 includes an inverter having cross-coupled output drivers with a parallel digital clamping circuit and serial-coupled enable switches.

During operation, the inverse enable signal (en_mx) controls enablement of the first level-shifting stage 410, and the enable signal (en) controls enablement of the second level-shifting stage 425. A digital signal controlled by the two-stage level shifter 400 is input at an input port (a), and input to the first level-shifting stage 410. The first level-shifting stage 410 shifts the voltage level of the input digital signal to make the input digital signal compatible with the first voltage domain (VDDMX). The digital output of the first level-shifting stage 410 is input to the second level-shifting stage 425. The second level-shifting stage 425 shifts the voltage level of the digital output of the first level-shifting stage 410 to make the digital output signal compatible with the second voltage domain (VDDX). The digital output of the second level-shifting stage 425 is buffered by a buffer 430, and output at an output port (Z). When power is removed to the portions powered by VDDMX and VDDIN, such as during power collapse, the output at the output port (Z) remains at a constant digital level, due to the second stage clamp.

The two-stage level-shifters 300, 400 are examples of the two stage level shifter 205 (LS w/clamp).

Figure 5:
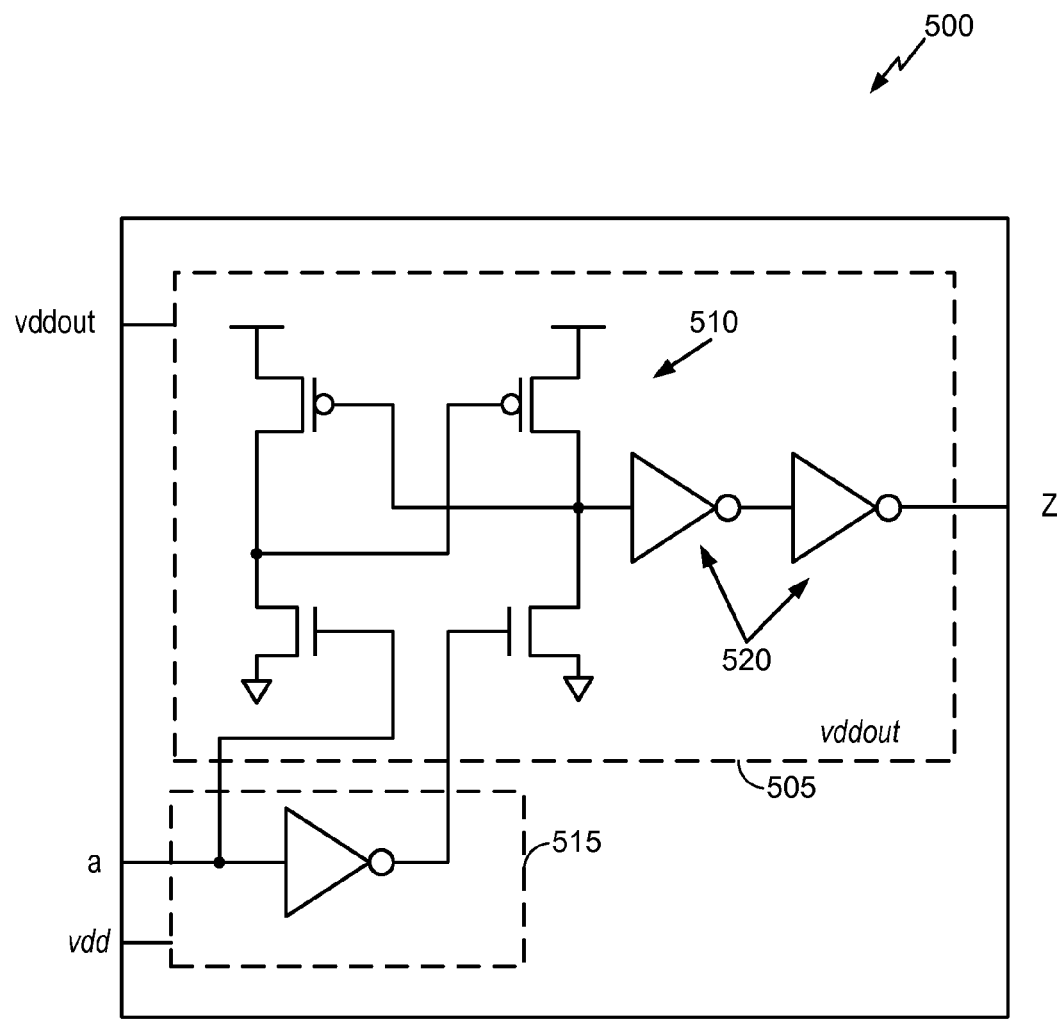
FIG. 5 depicts a single-stage level shifter without a clamp.

FIG. 5 depicts a single-stage level shifter 500 without a clamp (LS w/o clamp), which is an example of the single stage level shifter 210. The single-stage level shifter 500 has two separately-powered sections. A first section 505 including a level-shifting stage 510 is powered by a first voltage domain (VDDOUT), which can be part of a main power domain. A second section 515 is powered by a second voltage domain (VDD), which is part of a collapsible power domain. The level-shifting stage 510 includes an inverter having cross-coupled output drivers that feed an output buffer 520.

During operation, the single-stage level shifter 500 converts the input digital voltage level at an input (a) from the second voltage domain (VDDPX) to the first voltage domain (VDDOUT) at the output (Z). Because the second voltage domain (VDDPX) is part of a main power domain, the single-stage level shifter 500 does not require a clamp signal or a freeze signal.

Figure 6:
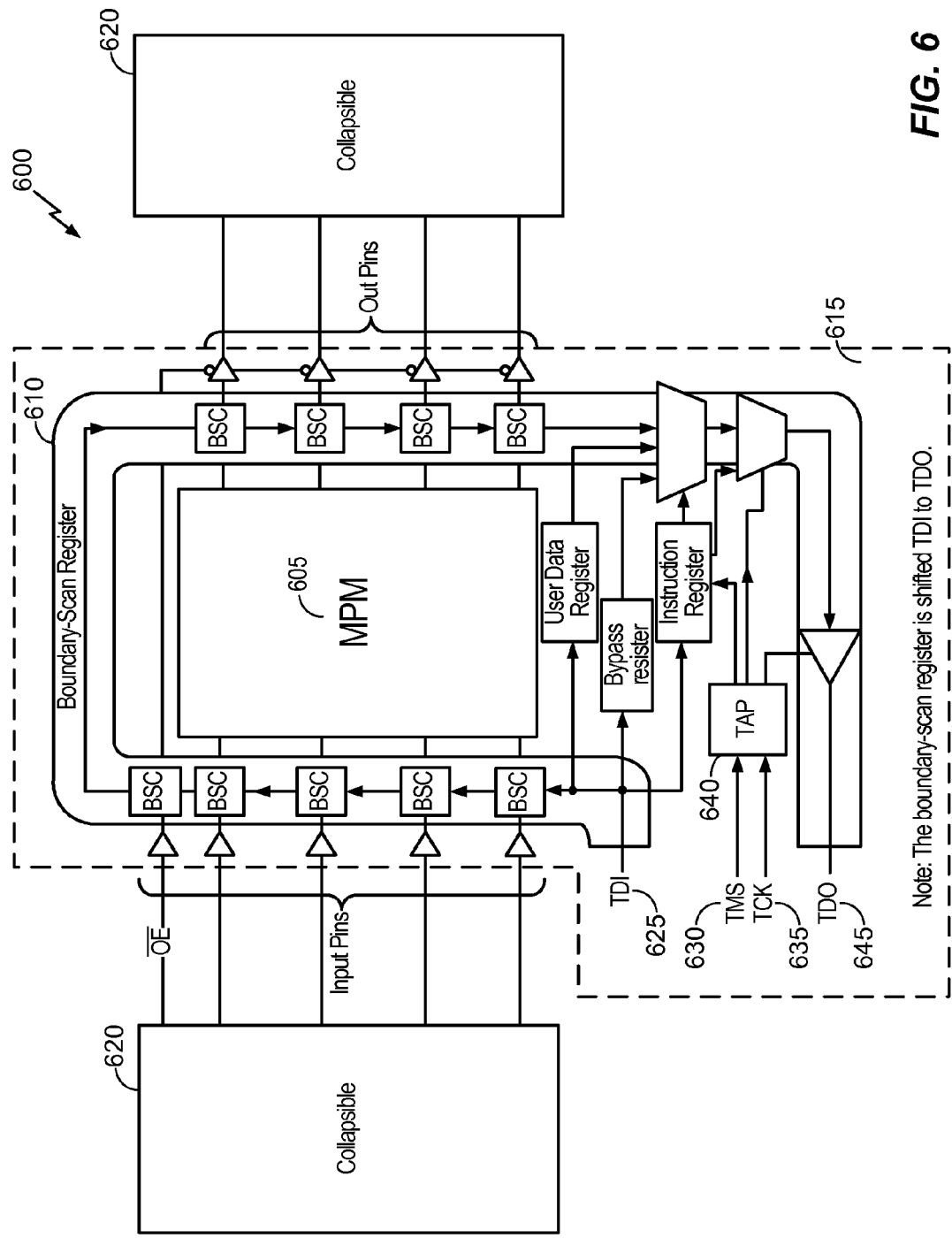
FIG. 6 depicts an exemplary power-collapsible boundary scan circuit.

FIG. 6 depicts an exemplary power-collapsible boundary scan circuit 600. The power-collapsible boundary scan circuit 600 has a modem station power manager (MPM) 605 and a boundary scan register chain (BSCAN) 610 in a main power domain 615 to input test values to a circuit in a collapsible power domain 620. The MPM 605 and the BSCAN 610 can also read output values from a circuit in the collapsible power domain 620. Thus, the BSCAN 610 can store the input test values and the output values when power is collapsed to the circuit in the power collapsible power domain 620, and when power is supplied to the circuit in the power-collapsible power domain 620.

The boundary scan circuit 600 can be JTAG-compatible. Accordingly, test data in 625 (TDI) can be scanned and/or shifted into the BSCAN 610. A test mode state 630 (TMS) and test clock 635 (TCK) are also input to the boundary scan circuit 600 at a test access port 640 (TAP), and control the test process. Test data is read from the BSCAN 610 at the test data out 645 (TDO) output. During the read process, the BSCAN data is read in a serial fashion, as the BSCAN data is shifted from TDI 625 to TDO 645.

Figure 7A:
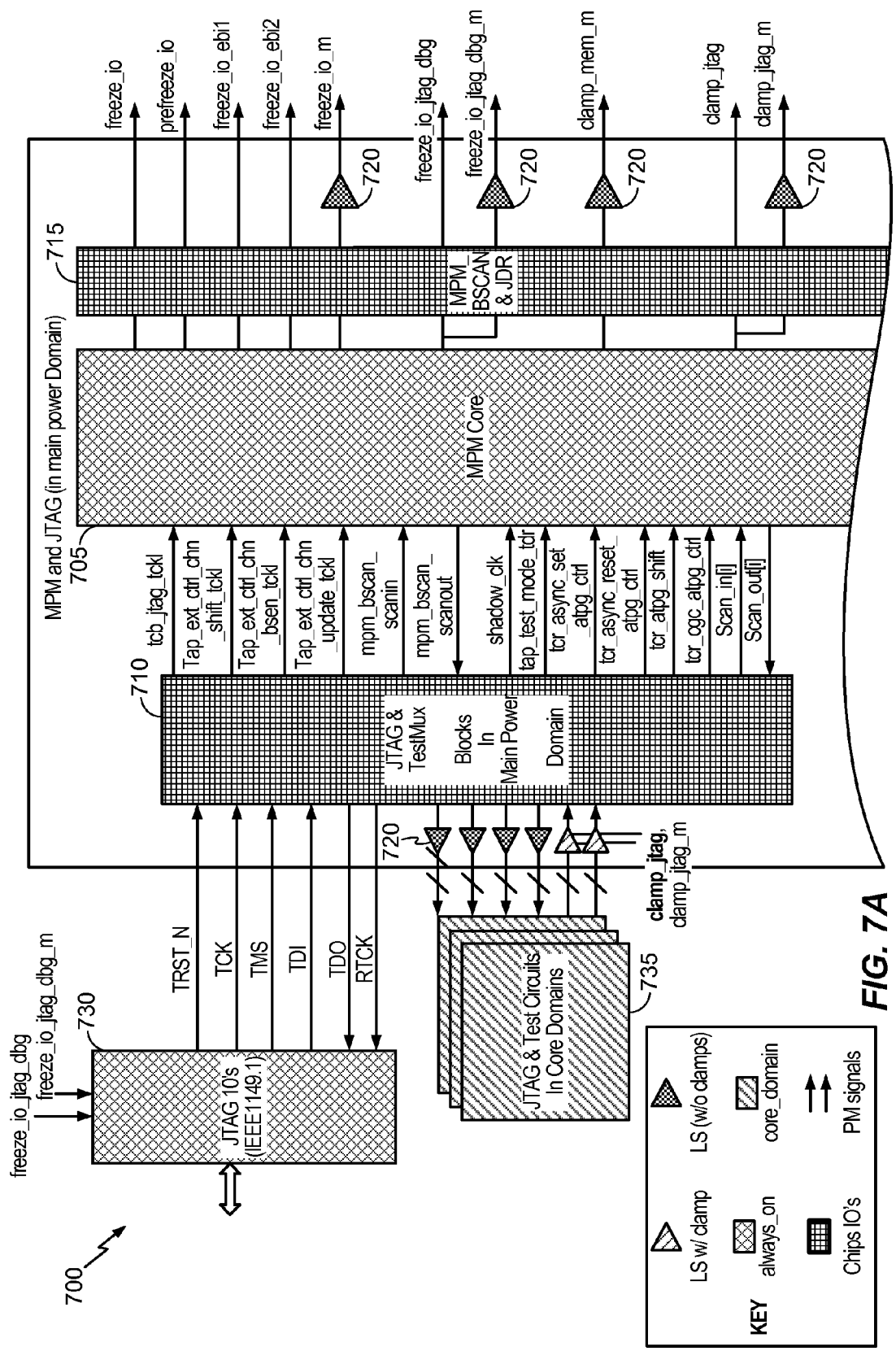
FIGS. 7A and 7B depict an exemplary IC that is testable with a partial power collapse.
Figure 7B:
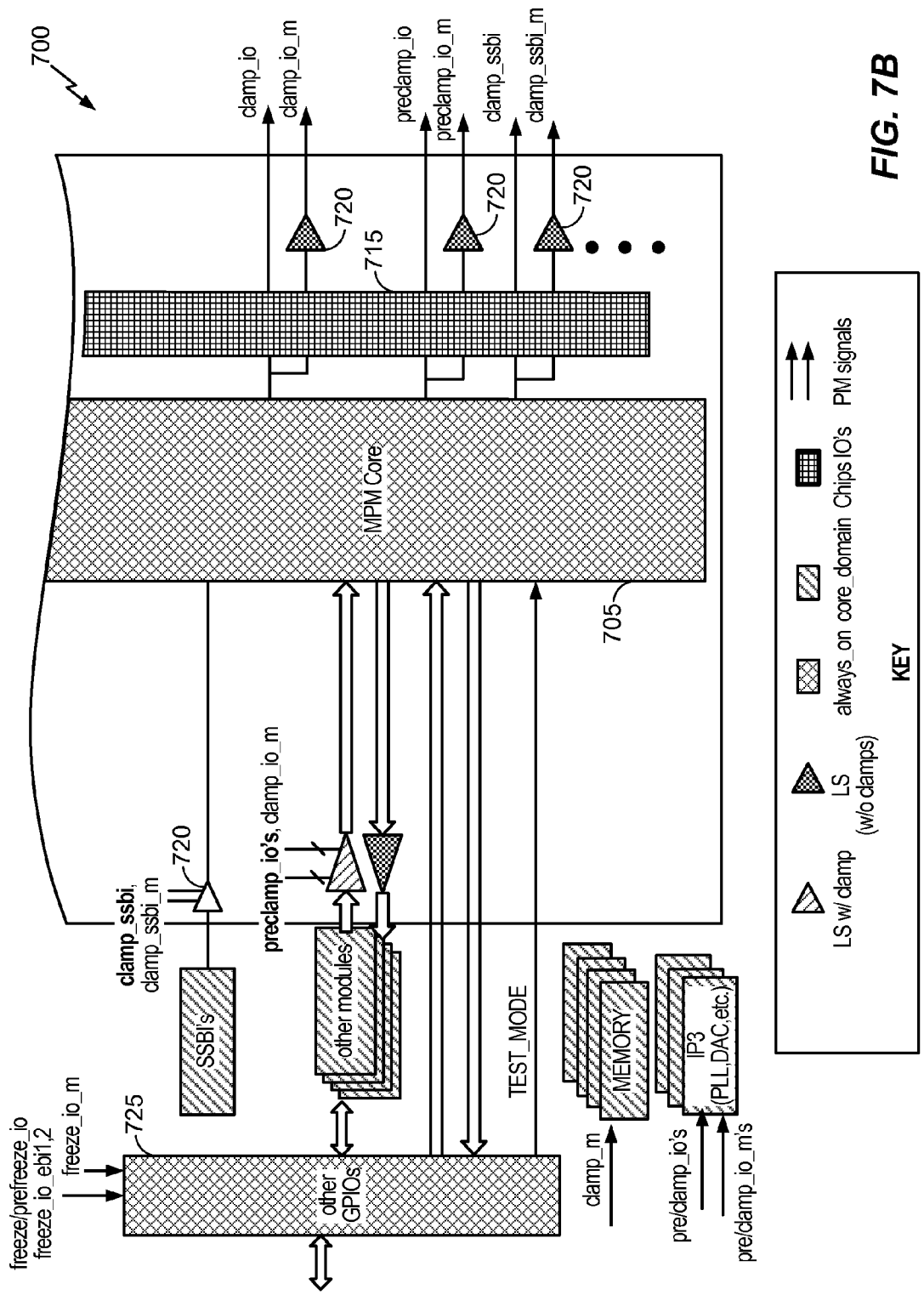

FIGS. 7A and 7B depict an exemplary IC 700 that is testable with a partial power collapse and includes a mobile station modem power manager (MPM) 705, a joint test action group-compatible test controller circuit 710 (JTAG), and a boundary scan register chain 715 (BSCAN). The MPM 705 and the JTAG controller circuit 710 are in a main power domain to facilitate full-chip power collapse IDDQ testing during an ATPG test. The IC 700 testing circuits enhance the breadth of ATPG testing by enabling control of clamp and freeze functions of level shifters 720 and general purpose in/out circuits 725 (GPIO) with the boundary scan register chain 715, as well as providing full-chip IDDQ testing. As detailed herein, a "freeze" signal controls isolating a chip-level in/out port (IO), and a "clamp" signal controls isolating an internal module in the IC 700. The MPM 705 generates the freeze and clamp signals, which are then stored in BSCAN registers 715.

In the IC 700, the Joint Test Action Group-compatible (JTAG) controller circuit 710 interfaces the MPM 705 to a JTAG IO circuit 730. The JTAG controller circuit 710 tests the input/output (IO) ports. The JTAG controller circuit 710 can be one of several JTAG controllers located on the IC 700. JTAG Test Access Ports (TAPS) interface the JTAG controller circuit 710 to a JTAG test structure 735. The boundary scan register chain 715 coupled to the JTAG circuits can test an interconnect, an internal module, a memory, etc. by selectively overriding a functionality of a pin coupled to the circuit under test. The boundary scan register chain 715 can be programmed using the JTAG controller circuit 710 to drive a signal onto the pin.

In addition to the MPM 705 being powered by the main power domain, the JTAG controller circuit 710 is also powered by the main power domain to facilitate ATPG full-chip power collapse testing. During the power collapsed IDDQ test, the JTAG controller circuit 710 is the only JTAG controller in control, as the other JTAG controllers have their power collapsed. The JTAG controller 710 can control the freeze and clamp signals stored in the boundary scan register chain 715 in the main power domain. The freeze and clamp signals can be used to isolate the main power domain from the collapsible power domain.

A special set of freeze_io and clamp_io signals are provided for JTAG chains (i.e., for any JTAG control transiting the collapsible power domain). This keeps JTAG paths across different power domains from being interrupted when other freeze_io and clamp_io signals are asserted during an ATPG test, such as an ATPG IDDQ test.

ATPG IDDQ testing can be performed in the power collapsed mode because the JTAG controller circuit 710 and the MPM 705 are in the main power domain, and boundary scan register chain 715 store the freeze and clamp signals. Thus, the power collapsible domain can be isolated and put into a power collapsed sleep mode. For example, core voltages can be controlled by header/footer switches, an external DC-DC converter, an on-chip DC-DC converter, and/or an on-chip LDO. The freeze signals can freeze circuits in the power-collapsible portions of the IC 700, such as off-chip memory interfaces, general purpose IOs, special IOs, etc. The clamp signals can isolate power-collapsible power domains including a core, a memory, an analog and mixed signal block, etc. from the main power domain. Moreover, ATPG coverage can be expanded to test the freeze and clamp signals as well, and also for testing the level shifters 720.

The power collapsible JTAG BSCAN architecture of the IC 700 enables performing an ATPG-controlled power collapse and IDDQ testing. The following exemplary method can be used to perform an ATPG IDDQ test:

1.) The IC to be tested is placed in a tester, and powered-up in a functional mode.

2.) An ATPG mode is enabled by asserting a TEST_MODE.

3.) An ATPG pattern is scanned and/or shifted into the boundary scan registers to mimic the functional mode when the full chip has power.

4.) The EXT_CTRL update signal is asserted so that clamp and/or freeze values will take effect.

5.) As soon as MSM JTAG asserts the EXT_CTRL update signal, the MPM and JTAG circuitry in the main domain are isolated, and functions of the chip-level GPIO's are frozen. Then, the VDD_CORE collapsible power domain is collapsed, and IDDQ testing to detect residue leakage starts.

6.) After the IDDQ test, the VDD_CORE collapsible power domain is repowered, with RESIN_N asserted and TEST_MODE de-asserted.

7.) The IC is now ready for IDDQ testing with full-chip power collapsed, using another ATPG pattern. Steps 2 through 6 can be repeated to perform other ATPG IDDQ tests.

Conventional testing forces the clamp and freeze_io signals to open in a lockstep manner, and does not enable independent control of the clamp and the freeze_io signals. A significant improvement over conventional testing methods is provided by the ability of exemplary embodiments to provide ATPG test coverage of level shifters and general purpose in/out circuits. In the provided examples, passing the MPM freeze_io and clamp_io signals through the BSCAN controls the freeze_io and clamp_io signals during the ATPG test. This enhances across-power-domain boundary test coverage, and enables power-collapsible ATPG test scenarios.

The freeze and/or clamp signals, to isolate the collapsible power domains, can be controlled by the boundary scan register chain, which is controlled by the JTAG TAP controller. Thus, the JTAG TAP controller can control the values for the freeze and clamp signals during testing. When the boundary scan register chain is used, the clamp and the freeze_io signals can be controlled independently to test for proper operation of the level shifters and general purpose in/out circuits under different test conditions.

Examples of signals controllable with a boundary scan register can include a freeze signal for freezing an off-chip memory interface and/or a freeze signal for freezing the JTAG interface. The freeze signal for freezing the JTAG interface must remain unfrozen during some types of testing. Other examples of signals controllable with a boundary scan register include a freeze signal for freezing regular GPIOs, and a freeze signal for freezing an IO circuit. Further examples of signals controllable with a boundary scan register include clamp signals that control clamping between a main digital domain (powered by VDD) and at least one collapsible power domain for a core, a memory, an analog signal block, and/or a mixed signal block. Examples of a signal controllable with a boundary scan register include a clamp signal to isolate: a first core voltage and VDD, a memory supply voltage and VDD, and a main power domain and VDD.

In an example, ATPG coverage of clamp, freeze functions of LS and GPIO's is provided at normal operational VDD. Also, ATPG coverage of clamp and freeze functions of the level shifters and the general purpose in/out circuits is provided at other supply voltages (e.g., SVS VDD). Further, ATPG coverage of clamp and freeze functions of the level shifters and the general purpose in/out circuits is provided while using a minimum supply voltage (VDD_MIN) mode. Additionally, provided is an ability to perform a memory clamp (Clamp_mem) and memory integrity check while using a minimum supply voltage (VDD_MIN). Also provided is a capability to independently check two of the freeze_io signals on the general purpose in/out circuits: Freeze_io__1p8 and freeze_io_m. Thus, independently controlling, with an ATPG pattern, the boundary scan registers through which the freeze and clamp signals can be passed provides many advantages over the conventional test methods.

The following exemplary ATPG test method realizes ATPG control of clamp and freeze functions of the level shifters and the general purpose in/out circuits.

1.) The IC to be tested is placed in a tester, and powered-up in a functional mode.

2.) An ATPG mode is enabled by asserting a TEST_MODE.

3.) An ATPG pattern is scanned and/or shifted in.

4.) The ATPG pattern is scanned into the BSCAN MPM registers, with the JTAG EXT_CTRL chain, using the ATPG pattern's clamp and freeze values.

5.) The BSCAN MPM registers are updated with the pattern's clamp and freeze values so that those clamp and freeze values will affect the IC.

6.) The ATPG pattern and the IC's chip IO outputs are captured and scanned to determine if the level shifter and the freeze_io signals are correctly functioning.

7.) Another ATPG pattern is scanned and/or shifted in to the BSCAN, and steps 3-6 are repeated until the ATPG tests are complete.

The following exemplary ATPG test method realizes an integrity check of clamp and freeze functions while the IC is in a minimum power (VDD_MIN) mode, or another power mode.

1.) The IC to be tested is placed in a tester, and powered-up in a functional mode.

2.) An ATPG mode is enabled by asserting a TEST_MODE.

3.) An ATPG pattern is scanned and/or shifted in.

4.) The ATPG pattern is scanned into the BSCAN MPM registers, with the JTAG EXT_CTRL chain, using the ATPG pattern's clamp and freeze values.

5.) The BSCAN MPM registers are updated with the pattern's clamp and freeze values so that those clamp and freeze values will take effect on the IC.

6.) The core voltage (VDD_CORE) is lowered to the minimum supply voltage (VDD_MIN)

7.) A time delay is executed.

8.) The core voltage (VDD_CORE) is raised substantially to a full rail voltage.

9.) The ATPG and the IC IO outputs are captured and scanned to determine if the level shifter and freeze_io signals are correctly functioning.

Figure 8:
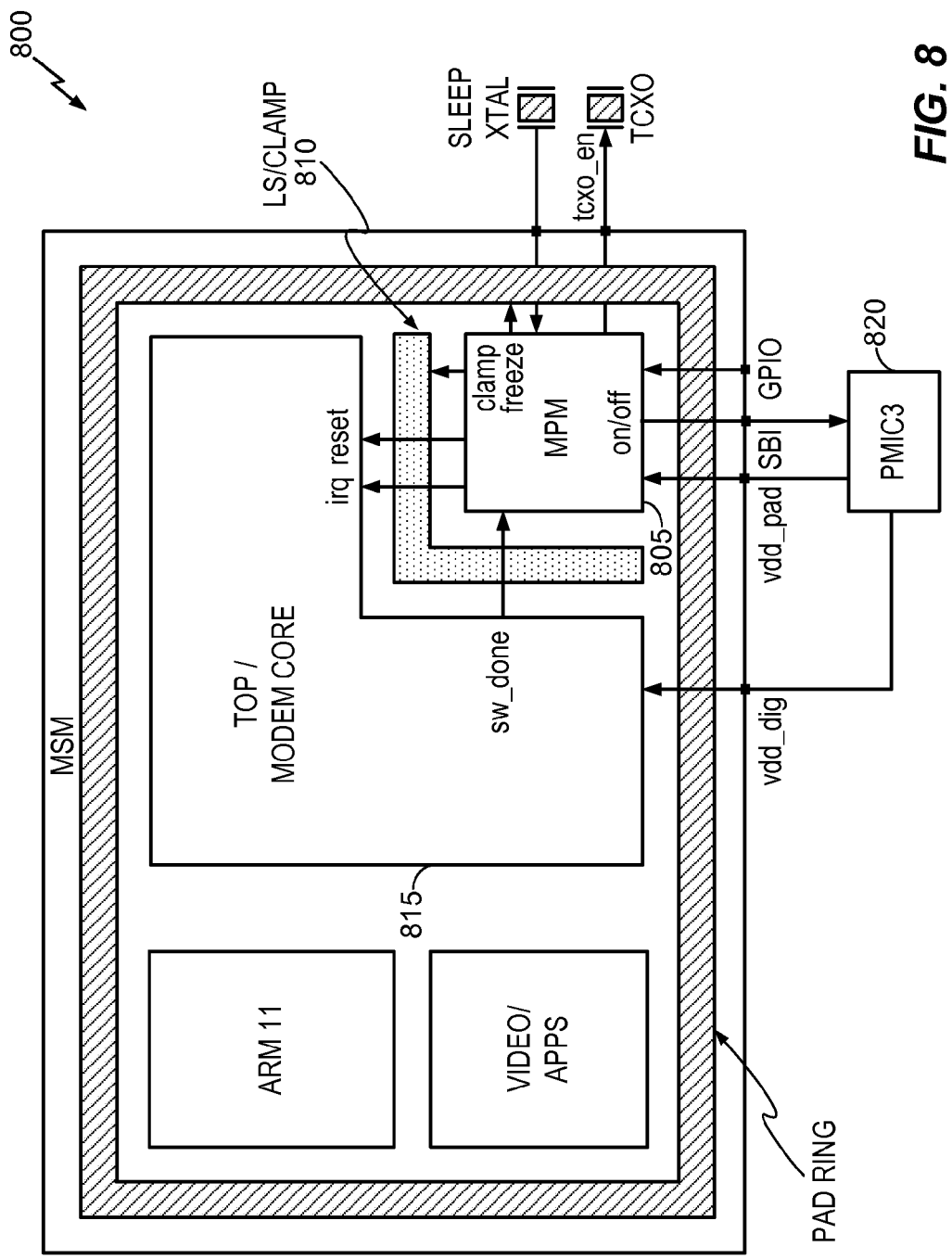
FIG. 8 depicts an exemplary mobile station modem

FIG. 8 depicts an exemplary mobile station modem (MSM) 800 that is testable with a partial power collapse and an MPM 805. The MPM 805 is in a main portion of the MSM 800, and is isolable from a power collapsible portion of the MSM 800 by level shifters 810. A modem core circuit 815 is in a power-collapsible portion of the MSM 800. A power management integrated circuit (PMIC) 820 controls power to the MSM 800.

Figure 9:
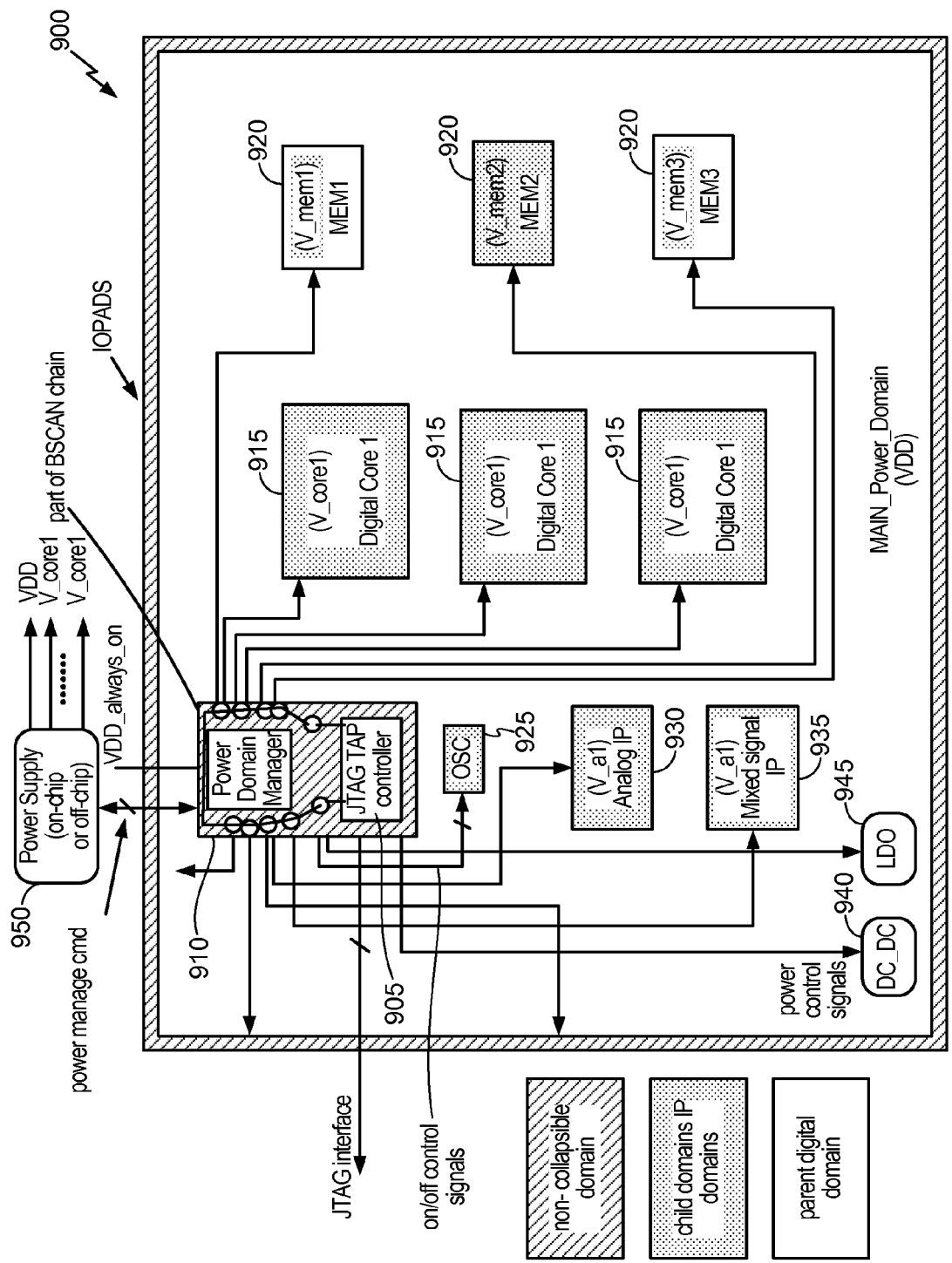
FIG. 9 depicts an exemplary circuit for measuring current leakage with an IDDQ test.

FIG. 9 depicts an exemplary circuit 900 for measuring current leakage with an IDDQ test during an ATPG test, while in a collapsed power mode. A JTAG controller 905 and a power domain manager 910 are located in a main power domain. Circuits for which quiescent current leakage can be measured are located in a power-collapsible power domain. Circuits in the power-collapsible power domain can include a digital core circuit 915, a memory circuit 920, an oscillator 925, an analog circuit 930, a mixed-signal circuit 935, a power conversion circuit 940, and/or and LDO 945. An off-chip power supply 950 can also be in the power-collapsible power domain.

Figure 10:
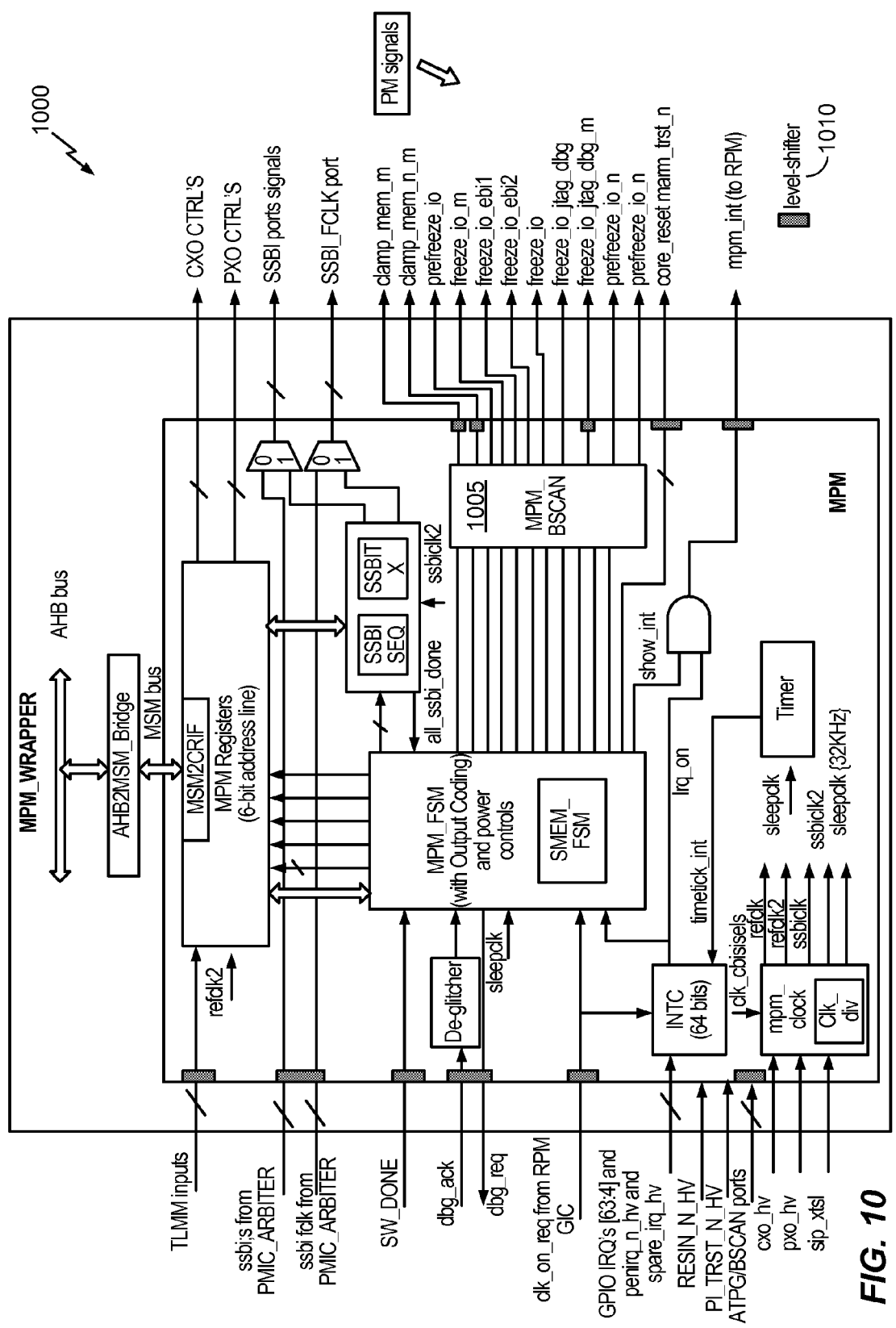
FIG. 10 depicts a top-level diagram of an exemplary mobile station modem sleep power manager.

FIG. 10 depicts a top-level diagram of an exemplary mobile station modem (MSM) sleep power manager (MPM) 1000. The MPM 1000 generates the freeze and clamp signals, including boundary scan register clamp and freeze_io signals, based on control signals provided by the JTAG test multiplexer. The MPM 1000 includes a boundary scan register chain 1005, and level shifters 1010 at a portion of the MPM's inputs and outputs.

Figure 11:
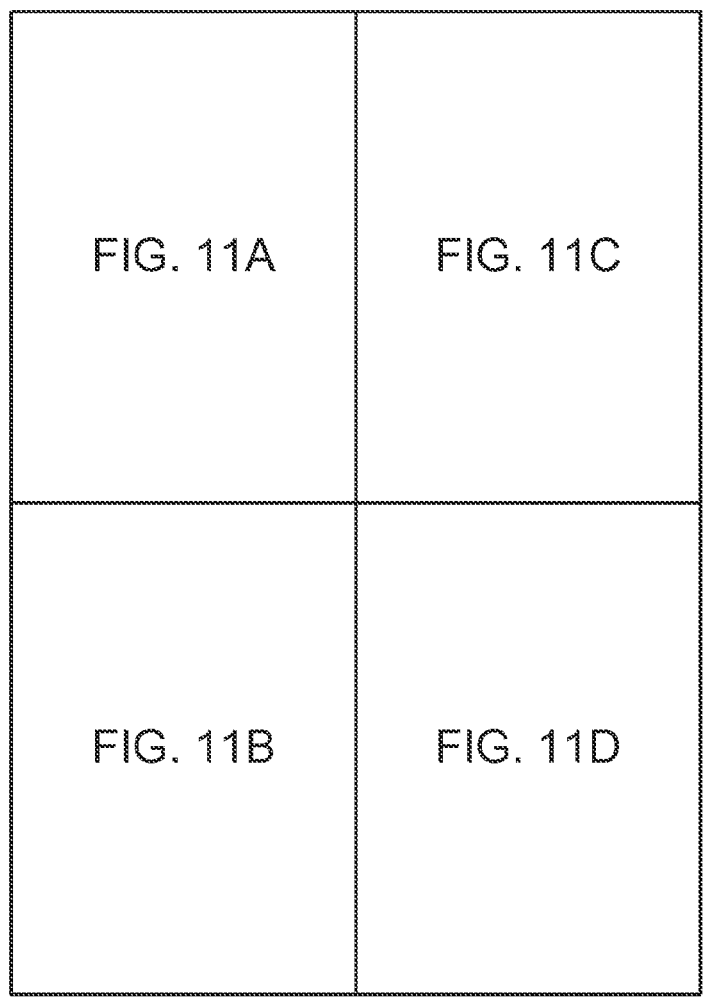
FIG. 11 depicts an exemplary always-on JTAG daisy chain control data register.
Figure 11A:
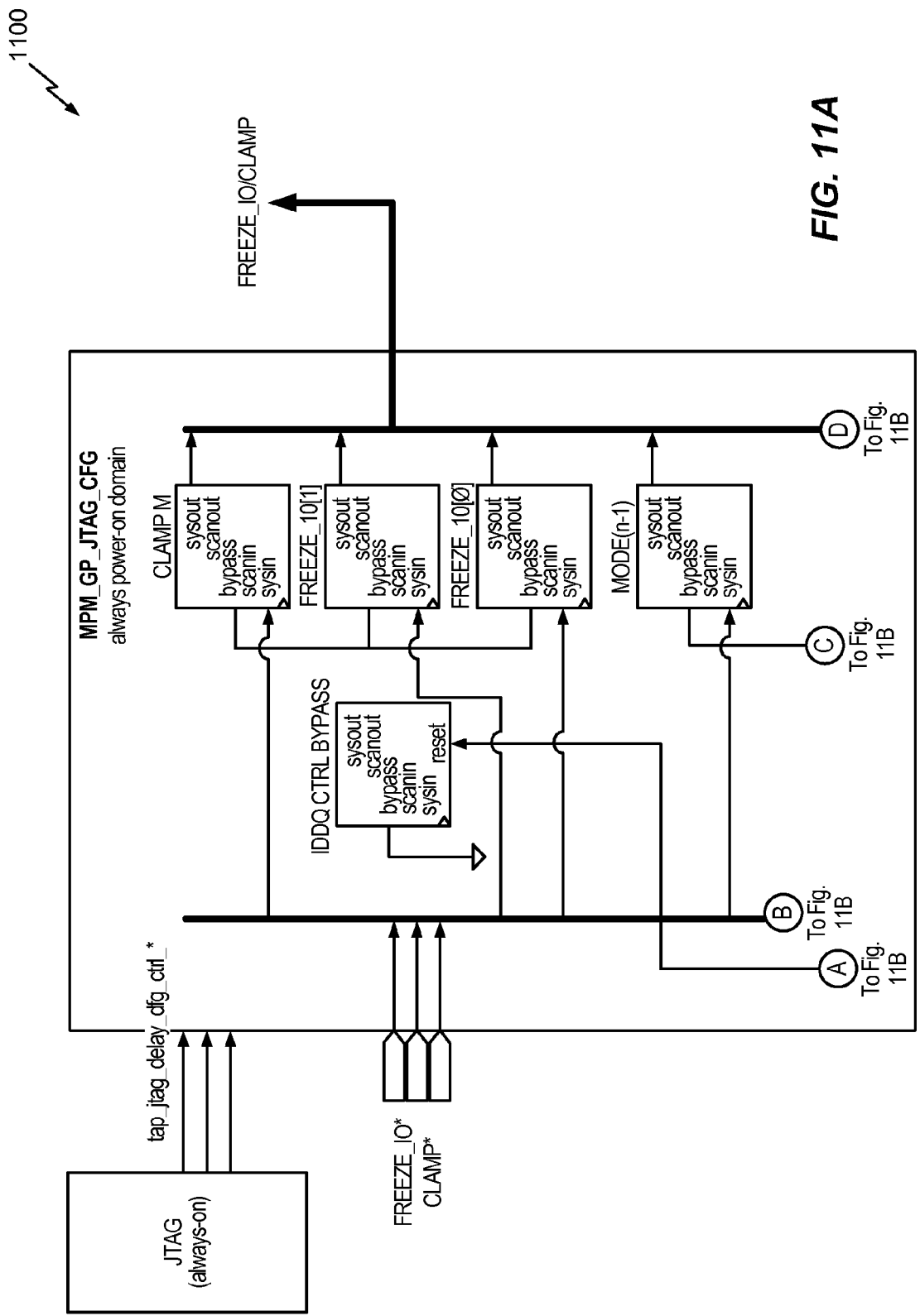
Figure 11B:
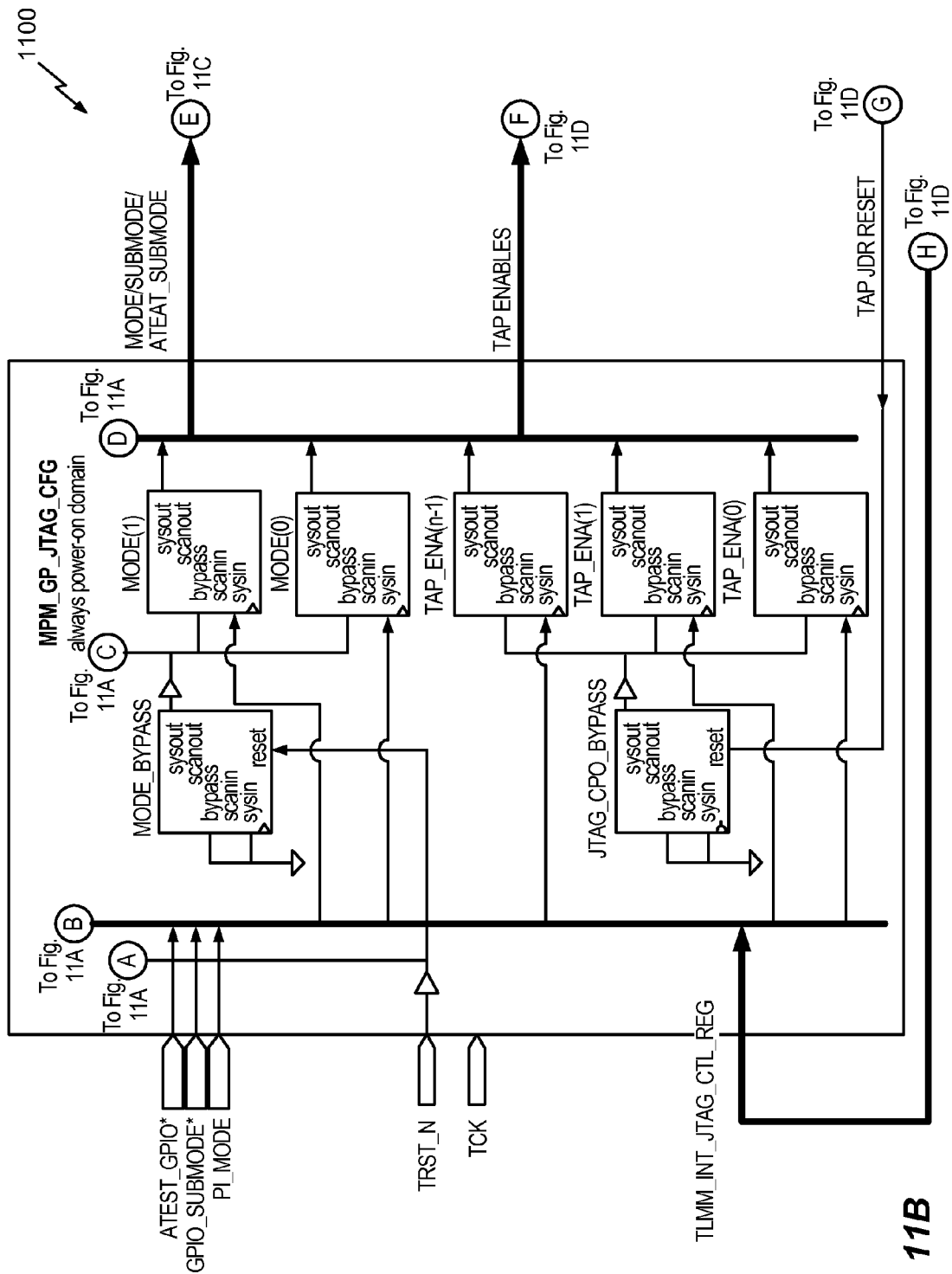
Figure 11C:
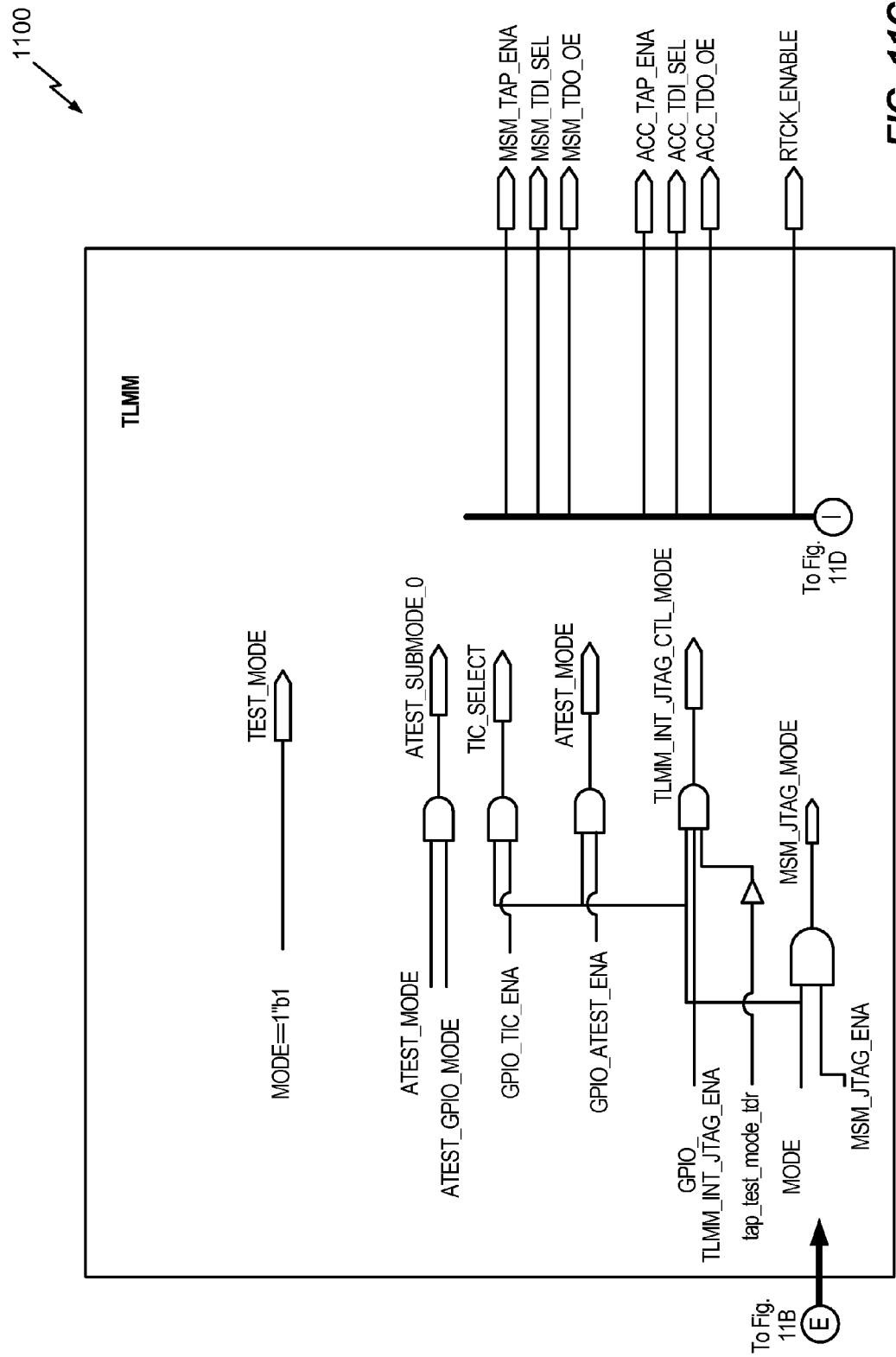
Figure 11D:
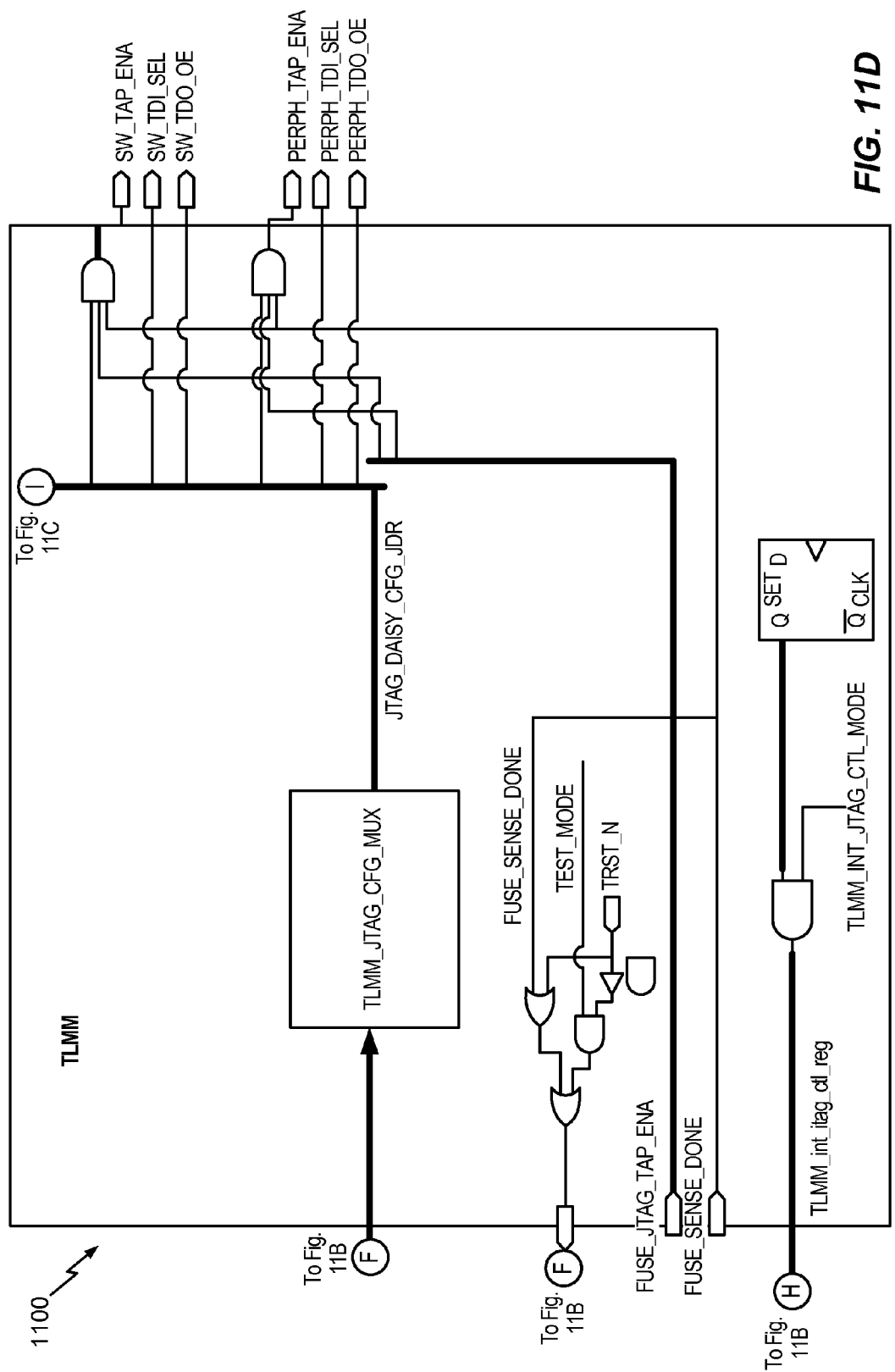

FIG. 11 depicts an exemplary always-on JTAG daisy chain control data register (JDR) 1100.

Figure 12:
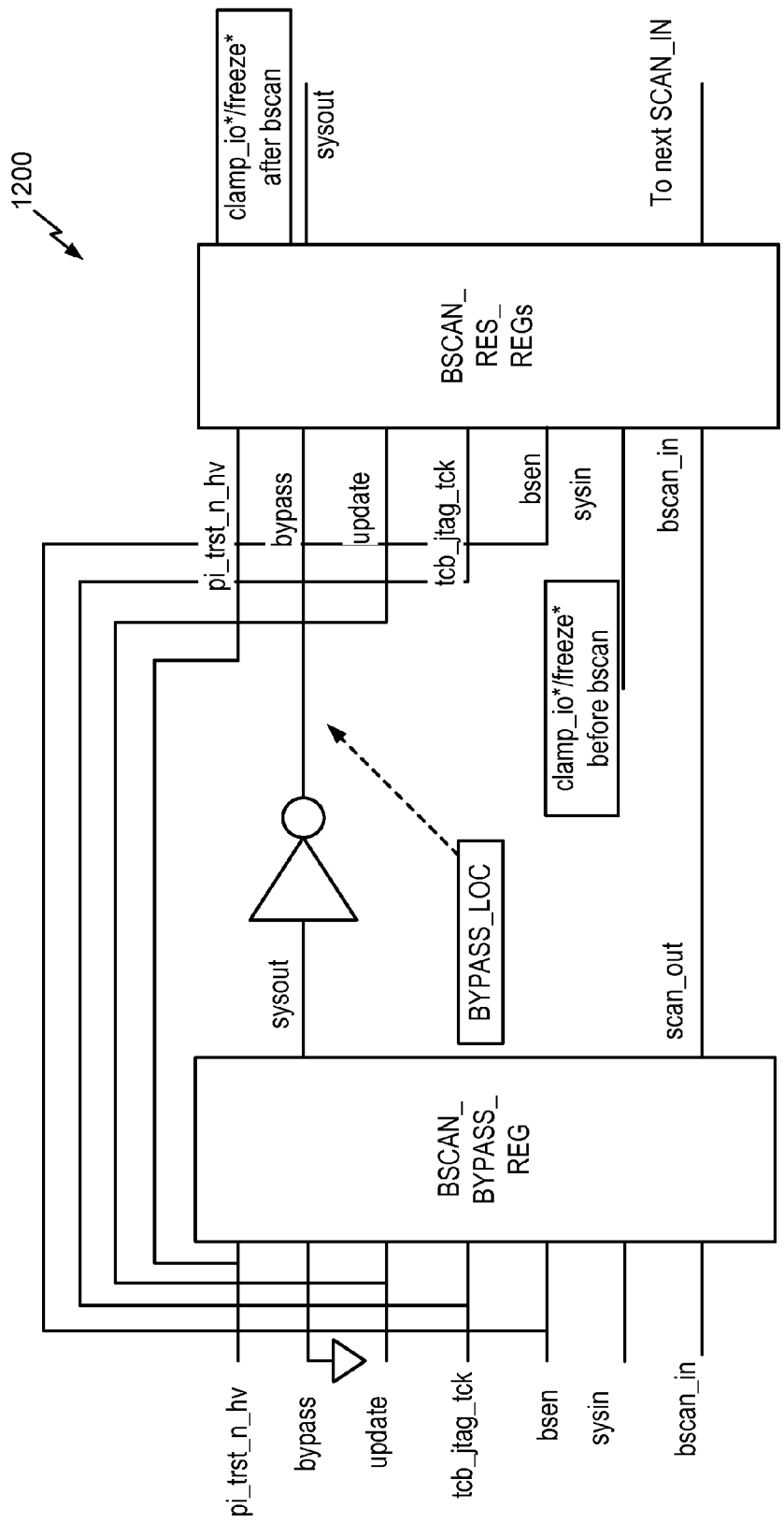
FIG. 12 depicts an exemplary local bypass generation circuit.

FIG. 12 depicts an exemplary local bypass generation circuit 1200. The local bypass generation circuit 1200 bypasses boundary-scannable outputs from the main power domain.

Figure 13:
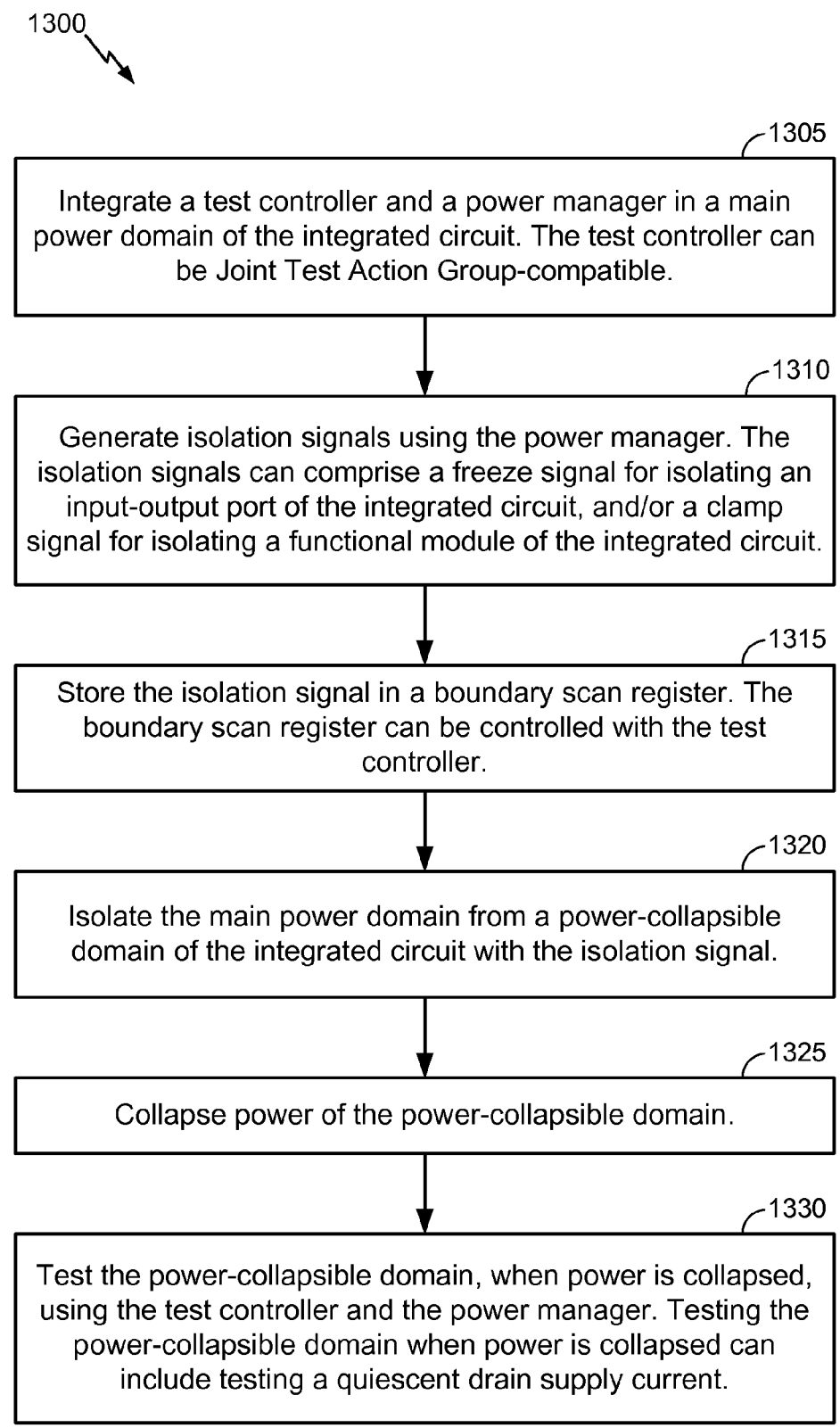
FIG. 13 depicts a method for testing an integrated circuit.

FIG. 13 depicts a method 1300 for testing an integrated circuit. At least a part of the method 1300 can be executed by at least a part of a device described herein. Not all steps are required, some are optional.

In step 1305, a test controller and a power manager in a main power domain are integrated on the integrated circuit. The test controller can be Joint Test Action Group-compatible.

In step 1310, an isolation signal is generated using the power manager. The isolation signal can comprise a freeze signal for isolating input-output ports of the integrated circuit, and/or a clamp signal for isolating a functional module of the integrated circuit.

In step 1315, the isolation signal is stored in a boundary scan register. The boundary scan register can be controlled with the test controller.

In step 1320, the main power domain is isolated from a power-collapsible domain of the integrated circuit with the isolation signal.

In step 1325, power of the power-collapsible domain is collapsed.

In step 1330, the power-collapsible domain is tested, when power is collapsed, using the test controller and the power manager. Testing the power-collapsible domain when power is collapsed can include testing a quiescent drain supply current.

CONCLUSION

Those of skill in the art will appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described herein. Accordingly, at least a portion of the devices described herein can be integrated in at least one semiconductor die.

Accordingly, embodiments can include machine-readable media or computer-readable media embodying instructions which, when executed by a processor, transform the processor and any other cooperating devices into a machine for fabricating at least a part of an apparatus described hereby.

Further, many embodiments are described in terms of sequences of actions to be performed by, for example, elements of a computing and/or lithographic device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

The teachings herein can be incorporated into various types of communication systems and/or system components. In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO RelO, RevA, RevB) technology and other technologies.

The teachings herein can be integrated into a device, selected from the group consisting of a set top box, music player, video player, entertainment unit, navigation device, communications device, personal digital assistant (PDA), fixed location data unit, and a computer.

Nothing that has been stated or illustrated is intended to cause a dedication of any component, step, feature, object, benefit, advantage, or equivalent to the public, regardless of whether it is recited in the claims.

While this disclosure shows exemplary embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order.

What is claimed is:

1. An integrated circuit, comprising:
a first integrated circuit portion having a main power domain;
a second integrated circuit portion having a collapsible power domain; and
a level shifter having an input coupled to the second circuit portion and an output coupled to the first integrated circuit portion, wherein the level shifter is configured to hold constant the level shifter output to an output level based on a pre-collapse input from the collapsible power domain, when power to the collapsible power domain is collapsed.

2. The integrated circuit of claim 1, further comprising a quiescent drain current measurement circuit coupled to test at least a part of the second integrated circuit portion.

3. The integrated circuit of claim 1, wherein the level shifter has at least two output voltage levels.

4. The integrated circuit of claim 1, further comprising a boundary scan register coupled between the level shifter output and the first integrated circuit portion.

5. The integrated circuit of claim 1, further comprising a power management circuit configured to generate a level shifter control signal and an inverted version of the level shifter control signal, each being output to the level shifter via a respective boundary scan register.

6. The integrated circuit of claim 5, further comprising a test access port coupled to control the power management circuit and the boundary scan registers.

7. The integrated circuit of claim 5, wherein the power management circuit is configured to generate a port isolation signal.

8. The integrated circuit of claim 5, wherein the power management circuit is configured to generate a memory isolation signal.

9. The integrated circuit of claim 5, wherein the power management circuit is configured to generate a scan and test chain isolation signal.

10. The integrated circuit of claim 5, wherein the power management circuit is configured to generate a single serial bus interface isolation signal.

11. The integrated circuit of claim 5, wherein the power management circuit is configured to generate an off-chip memory interface isolation signal.

12. The integrated circuit of claim 1, wherein the integrated circuit is integrated on a semiconductor die.

13. The integrated circuit of claim 1, further comprising a device, selected from the group consisting of a set top box, music player, video player, entertainment unit, navigation device, communications device, personal digital assistant (PDA), fixed location data unit, and a computer, into which the integrated circuit is integrated.

14. A non-transitory computer-readable medium, comprising instructions stored thereon that, if executed by a lithographic device, cause the lithographic device to fabricate at least a part of a device, comprising:
a first integrated circuit portion having a main power domain;
a second integrated circuit portion having a collapsible power domain; and
a level shifter having an input coupled to the second circuit portion and an output coupled to the first integrated circuit portion, wherein the level shifter is configured to hold constant the level shifter output to an output level based on a pre-collapse input from the collapsible power domain, when power to the collapsible power domain is collapsed.

15. The non-transitory computer-readable medium of claim 14, further comprising instructions stored thereon that, if executed by the lithographic device, cause the lithographic device to fabricate a quiescent drain current measurement circuit coupled to test at least a part of the second integrated circuit portion.

16. The non-transitory computer-readable medium of claim 14, wherein the level shifter has at least two output voltage levels.

17. The non-transitory computer-readable medium of claim 14, further comprising instructions stored thereon that, if executed by the lithographic device, cause the lithographic device to fabricate a boundary scan register coupled between the level shifter output and the first integrated circuit portion.

18. The non-transitory computer-readable medium of claim 14, further comprising instructions stored thereon that, if executed by the lithographic device, cause the lithographic device to fabricate a power management circuit configured to generate a level shifter control signal and an inverted version of the level shifter control signal, each being output to the level shifter via a respective boundary scan register.

19. The non-transitory computer-readable medium of claim 14, further comprising instructions stored thereon that, if executed by the lithographic device, cause the lithographic device to fabricate a test access port coupled to the control power management circuit and the boundary scan registers.

20. The non-transitory computer-readable medium of claim 14, wherein the power management circuit is configured to generate a port isolation signal.

21. The non-transitory computer-readable medium of claim 14, wherein the power management circuit is configured to generate a memory isolation signal.

22. The non-transitory computer-readable medium of claim 14, wherein the power management circuit is configured to generate a scan and test chain isolation signal.

23. The non-transitory computer-readable medium of claim 14, wherein the power management circuit is configured to generate a single serial bus interface isolation signal.

24. The non-transitory computer-readable medium of claim 14, wherein the power management circuit is configured to generate an off-chip memory interface isolation signal.

25. A method for testing an integrated circuit having a first integrated circuit portion with a main power domain, a second integrated circuit portion having a collapsible power domain, and a level shifter having an input coupled to the second circuit portion and an output coupled to the first integrated circuit portion, comprising:
   collapsing power to the collapsible power domain; and
   holding constant, using the level shifter, the level shifter output to an output level based on a pre-collapse input from the collapsible power domain, when power to the collapsible power domain is collapsed.

26. The method of claim 25, further comprising:
   generating an isolation signal using a power manager; and
   isolating the main power domain from the power-collapsible domain in response to the isolation signal.

27. The method of claim 26, wherein the isolation signal comprises at least one of a freeze signal for isolating input-output ports of the integrated circuit, and a clamp signal for isolating a functional module of the integrated circuit.

28. The method of claim 26, further comprising storing the isolation signal in a boundary scan register, and controlling the boundary scan register with a test controller.

29. The method of claim 25, further comprising:
   testing the power-collapsible domain when power is collapsed, using a test controller and a power manager.

30. The method of claim 29, wherein the testing the power-collapsible domain comprises testing a power supply current.

31. An integrated circuit, comprising:
   means for collapsing power to a collapsible power domain; and
   means for holding, using a level shifter, a level shifter output constant to an output level based on a pre-collapse input from the collapsible power domain, when power to the collapsible power domain is collapsed.

32. The integrated circuit of claim 31, further comprising:
   means for generating an isolation signal; and
   means for isolating a main power domain from the power-collapsible domain in response to the isolation signal.

33. The integrated circuit of claim 32, wherein the isolation signal comprises at least one of a freeze signal for isolating input-output ports of the integrated circuit, and a clamp signal for isolating a functional module of the integrated circuit.

34. The integrated circuit of claim 32, further comprising:
   means for storing the isolation signal in a boundary scan register, and
   means for controlling the boundary scan register.

35. The integrated circuit of claim 31, further comprising:
   means for testing the power-collapsible domain when power is collapsed.

36. The integrated circuit of claim 35, wherein the testing the power-collapsible domain comprises testing a power supply current.

37. The integrated circuit of claim 35, further comprising a device, selected from the group consisting of a set top box, music player, video player, entertainment unit, navigation device, communications device, personal digital assistant (PDA), fixed location data unit, and a computer, into which the integrated circuit is integrated.

* * * * *